United States Patent
Lee

(10) Patent No.: US 12,477,901 B2
(45) Date of Patent: Nov. 18, 2025

(54) LIGHT EMITTING DISPLAY DEVICE

(71) Applicant: Samsung Display Co., LTD., Yongin-si (KR)

(72) Inventor: Jun Hee Lee, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 760 days.

(21) Appl. No.: 17/721,865

(22) Filed: Apr. 15, 2022

(65) Prior Publication Data
US 2023/0093816 A1    Mar. 30, 2023

(30) Foreign Application Priority Data

Sep. 27, 2021  (KR) .................. 10-2021-0127033

(51) Int. Cl.
| | | |
|---|---|---|
| *H10K 59/122* | (2023.01) | |
| *H10K 50/813* | (2023.01) | |
| *H10K 50/818* | (2023.01) | |
| *H10K 50/822* | (2023.01) | |
| *H10K 50/86* | (2023.01) | |

(Continued)

(52) U.S. Cl.
CPC ......... *H10K 59/122* (2023.02); *H10K 50/813* (2023.02); *H10K 50/818* (2023.02); *H10K 50/822* (2023.02); *H10K 50/865* (2023.02); *H10K 2102/103* (2023.02); *H10K 2102/351* (2023.02)

(58) Field of Classification Search
CPC combination set(s) only.
See application file for complete search history.

(56) References Cited

U.S. PATENT DOCUMENTS

| | | | | |
|---|---|---|---|---|
| 2016/0013436 A1* | 1/2016 | Im | .......................... | H10K 50/84 |
| | | | | 257/40 |
| 2016/0365390 A1* | 12/2016 | Hsu | ........................ | H10D 86/40 |
| 2018/0102498 A1* | 4/2018 | Shin | ................ | H10K 59/80518 |

(Continued)

FOREIGN PATENT DOCUMENTS

| | | |
|---|---|---|
| KR | 10-2016-0083992 | 7/2016 |
| KR | 10-2016-0084546 | 7/2016 |

(Continued)

*Primary Examiner* — Mark W Tornow
*Assistant Examiner* — Priya M Rampersaud
(74) *Attorney, Agent, or Firm* — Harness, Dickey, & Pierce, P.L.C.

(57) ABSTRACT

A light emitting display device includes an organic layer positioned on a substrate and including an anode connection opening, an anode positioned on the organic layer and having electrical connection through the anode connection opening, a black pixel defining layer including an anode exposing opening exposing the anode and including a black-colored organic material, a cathode positioned on the black pixel defining layer and the anode, and an encapsulation layer covering the cathode. The anode includes an anode center portion overlapping the anode exposing opening and having a triple layer structure, and an anode peripheral portion extending from the anode center portion and including a transparent conductive material. The triple-layer structure includes a lower layer and an upper layer that include a transparent conductive material, and a middle layer that includes a metal material and reflects light.

16 Claims, 28 Drawing Sheets

(51) Int. Cl.
    *H10K 102/00*     (2023.01)
    *H10K 102/10*     (2023.01)

(56) References Cited

U.S. PATENT DOCUMENTS

2021/0111379 A1*   4/2021   Lee ................ H10K 59/80515
2022/0336557 A1   10/2022   Lee et al.

FOREIGN PATENT DOCUMENTS

| KR | 10-2016-0141175 | 12/2016 |
|---|---|---|
| KR | 10-2022-0144457 | 10/2022 |

* cited by examiner

LIGHT EMITTING DISPLAY DEVICE

CROSS-REFERENCE TO RELATED APPLICATION(S)

This application claims priority to and the benefit of Korean Patent Application No. 10-2021-0127033 under 35 U.S.C. § 119, filed in the Korean Intellectual Property Office on Sep. 27, 2021, the entire contents of which are incorporated herein by reference.

BACKGROUND

1. Technical Field

The disclosure relates to a light emitting display device that reduces reflection of external light by changing an anode structure, and solves a problem between a black pixel defining layer and an anode.

2. Description of the Related Art

A display device is a device that displays an image, and may include a liquid crystal display (LCD), an organic light emitting diode (OLED) display, and the like. Such a display device may be used in various electronic devices such as portable phones, navigation devices, digital cameras, electronic books, portable game devices, or various terminals.

A display device such as an organic light emitting diode (OLED) display may have a structure in which a display device may be bent or folded using a flexible substrate.

Optical elements such as cameras and optical sensors may be formed in the bezel region around the display area in small electronic devices such as portable phones, but as the size of the peripheral area of the display area is gradually reduced while the size of the screen to be displayed is increased, a technology has developed to allow a camera or optical sensor to be positioned on the back of the display area.

The above information disclosed in this Background section is only for enhancement of understanding of the background of the described technology, and therefore it may contain information that does not form the prior art that is already known in this country to a person of ordinary skill in the art.

SUMMARY

Embodiments are for improving display quality by reducing reflectance of external light and removing a problem between the black pixel defining layer and the anode.

A light emitting display device according to an embodiment may include an organic layer that is positioned on a substrate and includes an anode connection opening, an anode that is positioned on the organic layer and has electrical connection through the anode connection opening of the organic layer, a black pixel defining layer that includes an anode exposing opening exposing the anode and includes a black-colored organic material, a cathode that is positioned on the black pixel defining layer and the anode, and an encapsulation layer that covers the cathode. The anode may include an anode center portion that overlaps the anode exposing opening of the black pixel defining layer and has a triple layer structure, and an anode peripheral portion that extends from the anode center portion and includes a transparent conductive material. The triple-layer structure may include a lower layer and an upper layer that include a transparent conductive material and a middle layer that includes a metal material and reflect light.

The anode peripheral portion may have a single-layer structure.

The upper layer of the anode center portion may extend to form the anode peripheral portion.

The anode peripheral portion may cover a side surface of the anode center portion.

A part of the anode center portion may overlap the black pixel defining layer.

A gap between the anode exposing opening of the black pixel defining layer and an end of the anode center portion may be equal to or greater than about 1.5 μm and equal to or less than about 3.5 μm.

A gap between the anode exposing opening of the black pixel defining layer and an end of the anode peripheral portion may be equal to or greater than about 5.5 μm and equal to or less than about 9.5 μm.

The light emitting display device may further include a light blocking layer that is positioned on the encapsulation layer and includes a color filter opening, and a color filter that fills the color filter opening of the light blocking layer.

A gap between the color filter opening of the light blocking layer and an end of the anode center portion may be larger than the gap between the color filter opening of the light blocking layer and the end of the anode peripheral portion.

The gap between the color filter opening of the light blocking layer and the end of the anode center portion may be equal to or greater than about 3.5 μm and equal to or less than about 8.5 μm.

The gap between the color filter opening of the light blocking layer and the end of the anode peripheral portion may be equal to or greater than about 1.0 μm and equal to or less than about 2.0 μm.

A gap between the color filter opening of the light blocking layer and the anode exposing opening of the black pixel defining layer may be equal to or greater than about 4.5 μm and equal to or less than about 7.5 μm.

The light emitting display device may further include a sensing electrode that overlaps the light blocking layer in a plan view, and may be covered by the light blocking layer. The anode connection opening of the organic layer may overlap the black pixel defining layer and the light blocking layer, and the anode connection opening of the organic layer may overlap at least a part of the sensing electrode in a plan view.

The anode may further include a connection portion that extends from the anode center portion, and has a triple-layer structure.

A gap between the anode center portion and the anode connection opening may be equal to or less than about 12 μm.

The transparent conductive material may comprise at least one of an indium tin oxide (ITO), an indium zinc oxide (IZO), and a transparent conductive oxide (TCO).

The middle layer may comprise at least one of silver (Ag), lithium (Li), calcium (Ca), aluminum (Al), magnesium (Mg), and gold (Au).

The lower layer and the upper layer may comprise an indium tin oxide (ITO), and the middle layer may comprise silver (Ag).

The anode peripheral portion may have a double-layer structure.

The double-layer structure of the anode peripheral portion may comprise a layer that extends from the upper layer of the anode center portion, and another layer that extends from the lower layer of the anode center portion.

According to the embodiments, while reducing the reflectance of external light by using the black pixel defining layer, only a part of the center where external light is reflected in the anode may overlap the black pixel defining layer, the center where the external light is reflected is positioned in a part of regions where the anode and the black pixel defining layer may overlap, and the peripheral portion formed of a transparent conductive material may be positioned in the remaining part, thereby removing the floating problem that may occur between the black pixel defining layer and the anode. As a result, the display quality may be improved by reducing the reflectance of external light and removing the floating problem between the black pixel defining layer and the anode.

DETAILED DESCRIPTION OF THE EMBODIMENTS

Figure 1:
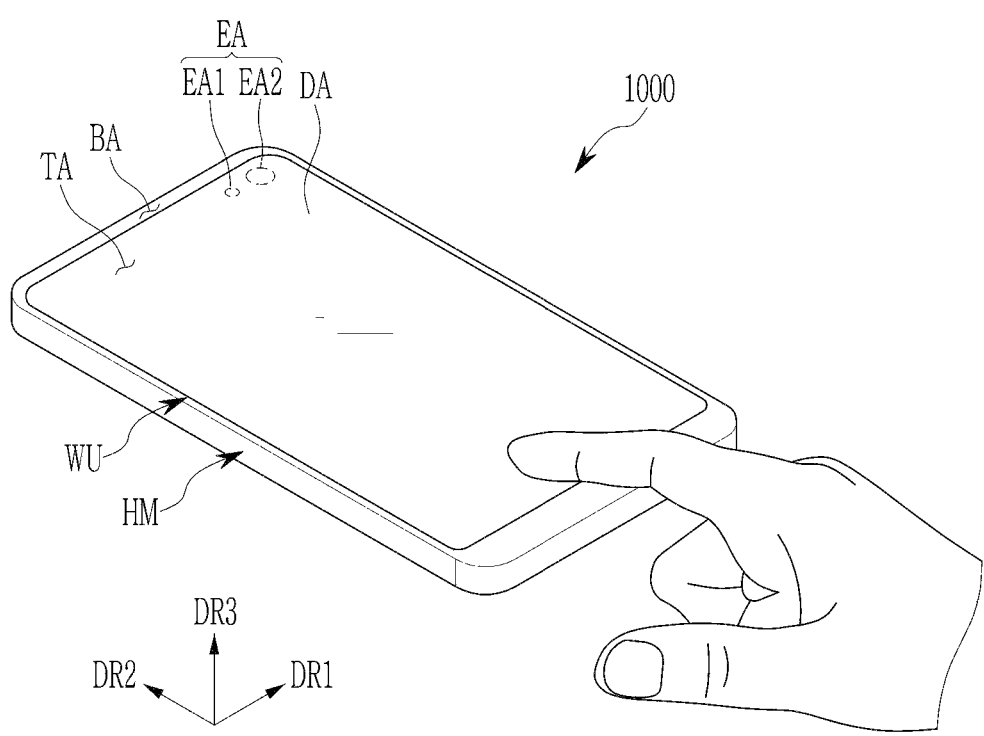
FIG. 1 is a schematic perspective view of a display device in use according to an embodiment.

The disclosure will be described hereinafter with reference to the accompanying drawings, in which embodiments are shown. As those skilled in the art would realize, the described embodiments may be modified in various different ways.

The drawings and description are to be regarded as illustrative in nature and not restrictive. Like reference numerals designate like elements throughout the specification.

Since the size and thickness of each configuration shown in the drawings are arbitrarily indicated for better understanding and ease of description, the disclosure is not necessarily limited to the drawings. In the drawings, the thickness of layers, films, panels, regions, etc., may be exaggerated for clarity. In the drawings, the thickness of some layers and regions may be exaggerated for better understanding and ease of description.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

Unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Figure 2:
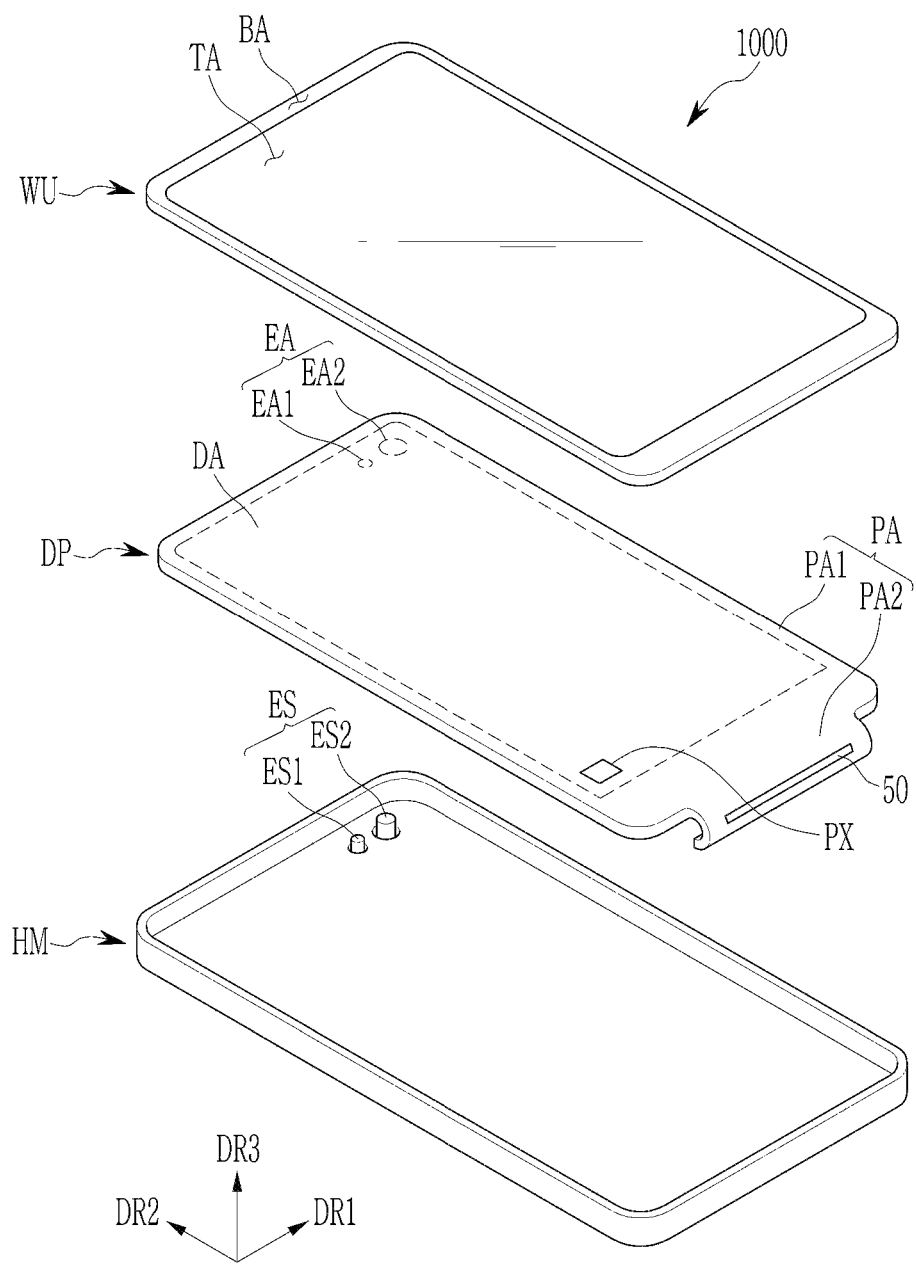
FIG. 2 is an exploded perspective view of the display device according to an embodiment.
Figure 3:
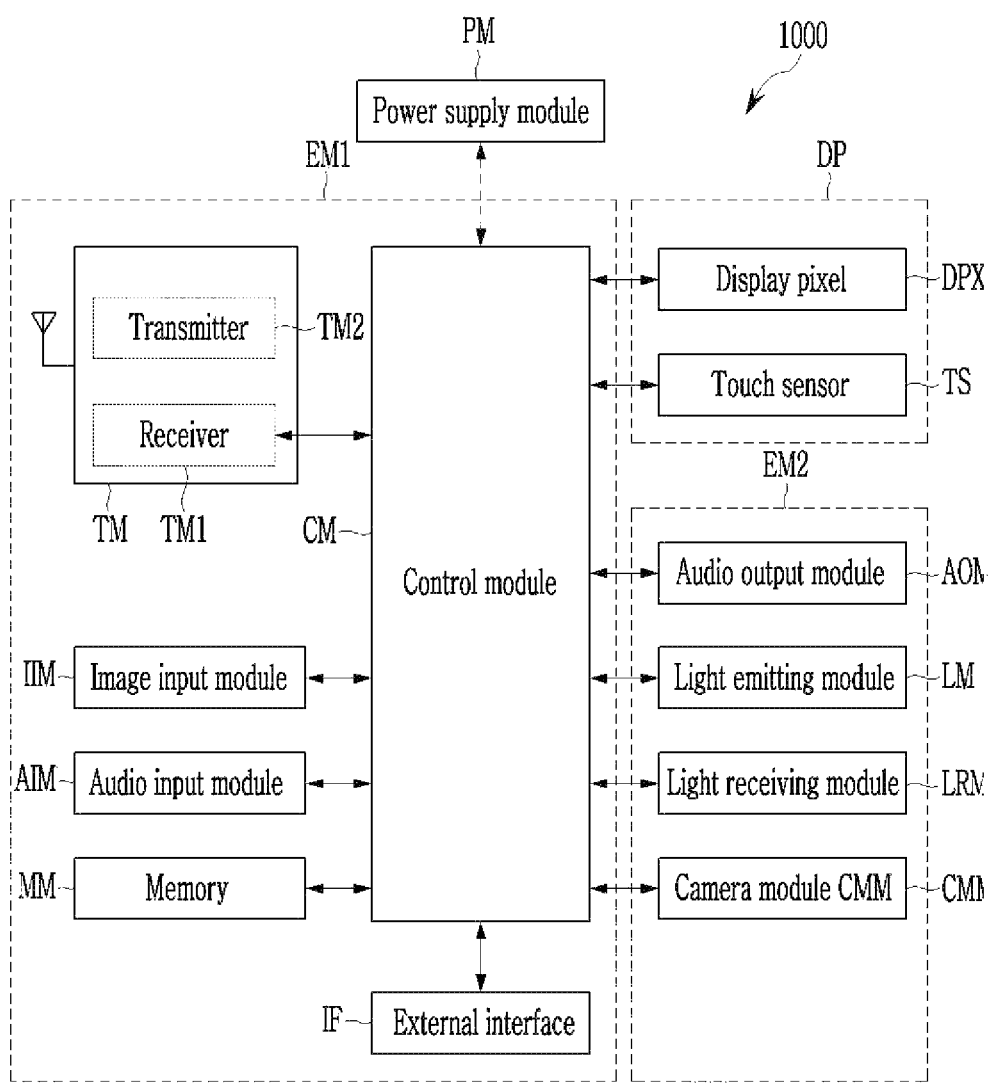
FIG. 3 is a block diagram of the display device according to an embodiment.

Hereinafter, a schematic structure of a display device will be described with reference to FIG. 1 to FIG. 3. FIG. 1 is a schematic perspective view of a display device in use according to an embodiment, FIG. 2 is an exploded perspective view of the display device according to an embodiment, and FIG. 3 is a schematic block diagram of the display device according to an embodiment.

Referring to FIG. 1, a display device 1000 according to an embodiment is a device that displays a motion picture or a still image, and may be used as a display screen not only in various portable electronic devices such as a mobile phone, a smart phone, a tablet personal computer, a mobile communication terminal, an electronic notebook, an electronic book, a portable multimedia player (PMP), a navigation unit, an ultra-mobile PC (UMPC), and the like but also in various products such as a television, a laptop, a monitor, a billboard, an Internet of things (JOT), and the like. The display device 1000 according to the embodiment may be used in a wearable device such as a smart watch, a watch phone, a glasses display, and a wearable device such as a head mounted display (HMD). The display device 1000 according to the embodiment may also be used as an instrument panel of a car, a center fascia or a center information display (CID) disposed on a dashboard of a vehicle, a room mirror display that replaces a side mirror of a car, or a display disposed on the back of the front seat for entertainment for a passenger seat in the rear seat of the vehicle. FIG. 1 illustrates that the display device 1000 is used for a smart phone for better comprehension and ease of description.

The display device 1000 may display an image toward a third direction DR3 on a display plane that is parallel to a first direction DR1 and a second direction DR2. The display plane where an image is displayed may correspond to a front surface of the display device 1000, and may correspond to a front surface of a cover window WU. The image may include a motion picture as well as a still image.

In the embodiment, the front (or top) and back (or bottom) of each member are defined with reference to the direction in which the image is displayed. The front and rear surfaces may be opposed to each other in the third direction DR3, and the normal directions of the front and rear surfaces may be parallel to the third direction DR3. A separation distance in the third direction DR3 between the front and rear surfaces may correspond to the thickness of the display panel in the third direction DR3.

The display device 1000 according to the embodiment may detect a user's input (refer to the hand in FIG. 1) applied from the outside. A user's input may include various types of external inputs such as a part of the user's body, light, heat, or pressure. In the embodiment, the user's input is shown as the user's hand applied to the front surface. However, the disclosure is not limited thereto. The user's input may be provided in various forms, and the display device 1000 may detect the user's input applied to the side or the rear surface of the display device 1000 according to the structure of the display device 1000.

Referring to FIG. 1 and FIG. 2, the display device 1000 may include the cover window WU, a housing HM, a display panel DP, and an optical element ES. In the embodiment, the cover window WU and housing HM may be combined to configure the appearance of the display device 1000.

The cover window WU may include an insulation panel. For example, the cover window WU may be made of glass, plastic, or a combination thereof.

The front of the cover window WU may define the front surface of the display device 1000. The transmissive area TA may be an optically transparent region. For example, the transmissive area TA may be a region having visible ray transmittance of about 90% or more.

The blocking area BA may define the shape of the transmissive area TA. The blocking area BA may be adjacent to the transmissive area TA and may surround the transmissive area TA. The blocking area BA may be a region having relatively low light transmittance compared to the transmissive area TA. The blocking area BA may include an opaque material that blocks light. The blocking area BA may have a color. The blocking area BA may be defined by a bezel layer provided separately from a transparent substrate defining the transmissive area TA, or may be defined by an ink layer formed by inserting or coloring the transparent substrate.

The display panel DP may include a display panel DP that displays an image, and a driver 50. The display panel DP may include a front surface including a display area DA and a peripheral area PA. The display area DA may be a region in which a pixel operates according to an electrical signal and emits light.

In the embodiment, the display area DA may be a region in which an image is displayed including a pixel, and simultaneously a region in which an external input is sensed by a touch sensor positioned on an upper side of the pixel in the third direction DR3.

The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize an image through the transmissive area TA or provide an external input based on the image. However, the disclosure is not limited thereto. For example, in the display area DA, a region where an image is displayed and a region where an external input is sensed may be separated from each other.

The peripheral area PA of the display panel DP may at least partially overlap the blocking area BA of the cover window WU. The peripheral area PA may be a region covered by the blocking area BA. The peripheral area PA may be adjacent to the display area DA and may surround the display area DA. An image may not be displayed in the peripheral area PA, and a driving circuit or driving wire for driving the display area DA may be disposed in the peripheral area PA. The peripheral area PA may include a first peripheral area PA1 and a driver 50 positioned outside the display area DA, and a second peripheral area PA2 including a connecting wire and a bending region. In the embodiment of FIG. 2, the first peripheral area PA1 may be positioned on a third side of the display area DA, and the second peripheral area PA2 may be positioned on the other side of the display area DA.

In the embodiment, the display panel DP may be assembled in a flat state with the display area DA and the peripheral area PA facing the cover window WU. However, the disclosure is not limited thereto. A part of the peripheral area PA of the display panel DP may be bent. A part of the peripheral area PA may face the rear surface of the display device 1000 such that the blocking area BA shown on the front surface of the display device 1000 may be reduced, and in FIG. 2, the second peripheral area PA2 may be assembled after the second peripheral area PA2 is bent and positioned on the back side of the display area DA.

The display panel DP may include an element area EA may include a first element area EA1 and a second element area EA2. The first element area EA1 and the second element area EA2 may be at least partially surrounded by the display area DA. Although the first element area EA1 and the second element area EA2 are illustrated to be spaced apart from each other, the disclosure is not limited thereto and at least part of them may overlap. The first element area EA1 and the second element area EA2 may be areas in which components using infrared rays, visible rays, sound, and the like are disposed thereunder.

In the display area DA, multiple light emitting elements and multiple pixel circuit portions for generating and transmitting a light emitting current to each of the multiple light emitting elements may be formed. Here, one light emitting element and one pixel circuit portion are referred to as a pixel PX. In the display area DA, one pixel circuit portion and one light emitting element may be formed on a one-to-one basis.

The first element area EA1 may include a region that consist of a transparent layer to allow light to pass through, may not include a conductive layer or a semiconductor layer, and may have a structure that does not block light by including an opening that overlaps a pixel defining layer that includes a light blocking material and a light blocking layer.

The second element area EA2 may include a transmissive portion through which light or/and sound may pass and a display portion including multiple pixels. The transmissive portion may be positioned between adjacent pixels and may be formed of a transparent layer through which light or/and sound can pass. The display portion may be formed to have one unit structure by adding multiple pixels, and the transmissive portion may be positioned between adjacent unit structures.

Referring to FIG. 3 together with FIG. 1 and FIG. 2, the display panel DP may include the display area DA where a display pixel is included, and a touch sensor TS. The display panel DP may be visually recognized by a user from the outside through the transmissive area TA, including the pixel that creates an image. The touch sensor TS may be positioned on an upper portion of the pixel PX, and may sense an external input applied from the outside. The touch sensor TS may detect an external input provided to the cover window WU.

Referring back to FIG. 2, the second peripheral area PA2 may include a bending portion. The display area DA and the first peripheral area PA1 may have a flat area, which is an area that is substantially parallel to a plane defined by the first direction DR1 and the second direction DR2, and one side of the second peripheral area PA2 may extend from the flat area and may pass through the bending portion and then may have a flat area again. As a result, at least a portion of the second peripheral area PA2 may be bent and assembled to be positioned on the back side of the display area DA. At least a portion of the second peripheral area PA2 may overlap the display area DA in a plan view when assembled, and thus the blocking area BA of the display device 1000 may be reduced. However, the disclosure is not limited thereto. For example, the second peripheral area PA2 may not be bent.

The driver 50 may be mounted on the second peripheral area PA2, and may be mounted on a bending portion or positioned on one of both sides of the bending portion. The driver 50 may be provided in the form of a chip.

The driver 50 may be electrically connected to the display area DA to transmit an electrical signal to the display area DA. For example, the driver 50 may provide data signals to pixels PX disposed to the display area DA. In other embodiments, the driver 50 may include a touch driving circuit, and may be electrically connected to the touch sensor TS disposed in the display area DA. The driver 50 may include various circuits in addition to the above-described circuits or may be designed to provide various electrical signals to the display area DA.

The display device 1000 may have a pad portion positioned at the end of the second peripheral area PA2, and may be electrically connected to a flexible printed circuit board (FPCB) including a driving chip by the pad portion. Here, the driving chip positioned on the FPCB may include various driving circuits for driving the display device 1000 or connectors for power supply. Depending on embodiments, instead of the FPCB, a rigid printed circuit board (PCB) may be used.

The optical element ES may be disposed under the display panel DP. The optical element ES may include a first optical element ES1 overlapping the first element area EA1 and a second optical element ES2 overlapping the second element area EA2.

The first optical element ES1 may be an electronic element using light or sound. For example, the first optical element ES1 may be a sensor that receives and uses light such as an infrared sensor, a sensor that outputs and senses light or sound to measure a distance or recognizes a fingerprint, a small lamp that outputs light, or a speaker that outputs a sound, and the like. In the case of an electronic element using light, light of various wavelength bands such as visible light, infrared light, and ultraviolet (UV) light may be used.

The second optical element ES2 may be at least one of a camera, an infrared (IR) camera, a dot projector, an infrared illuminator, and a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, among the configuration of the display panel DP, the display pixel DPX and the touch sensor TS positioned in the display area DA are shown.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be mounted (e.g., directly mounted) on the motherboard electrically connected to the display panel DP or mounted on a substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules may be not mounted on the motherboard, but may be electrically connected to the motherboard through the FPCB.

The control module CM may control the overall operation of the display device 1000. The control module CM may be a microprocessor. For example, the control module CM may activate or deactivate the display panel DP. The control module CM may control other modules such as the image input module IIM or the audio input module AIM based on a touch signal received from the display panel DP.

The wireless communication module TM may transmit or receive a wireless signal with another terminal using a Bluetooth or Wi-Fi line. The wireless communication module TM may transmit or receive voice signals using a general communication line. The wireless communication module TM may include a transmitter TM2 that modulates and transmits a signal to be transmitted, and a receiver TM1 that demodulates a received signal.

The image input module IIM may process the video signal and convert the processed signal into image data that may be displayed on the display panel DP. The audio input module AIM may receive an external sound signal input by a microphone in a recording mode, a voice recognition mode, and the like and may convert the received signal into electrical voice data.

The external interface IF may serve as an interface connected to an external charger, a wired or wireless data port, a card socket (e.g., a memory card, a SIM or UIM card), and the like.

The second electronic module EM2 may include an audio output module AOM, a light emitting module LM, a light receiving module LRM, and a camera module CMM, and at least some of these may be optical elements ES, which may be positioned on the back side of the display panel DP as shown in FIG. 1 and FIG. 2. The optical element ES may include a light emitting module LM, a light receiving module LRM, and a camera module CMM. The second electronic module EM2 may be mounted (e.g., directly mounted) on the motherboard, mounted on a separate substrate and electrically connected to the display panel DP through a connector (not shown), or electrically connected to the first electronic module EM1.

The audio output module AOM may convert audio data received from the wireless communication module TM or audio data stored in the memory MM and output it to the outside.

The light emitting module LM may generate and output light. The light emitting module LM may output infrared light. The light emitting module LM may include an LED element. For example, the light receiving module LRM may detect infrared light. The light receiving module LRM may be activated when infrared light above a level is detected. The light receiving module LRM may include a CMOS sensor. After infrared light generated by the light emitting module LM is output, the infrared light may be reflected by an external subject (e.g., a user's finger or face), and the reflected infrared light may be incident on the light receiving module LRM. The camera module CMM may take an external image.

In an embodiment, the optical element ES may include a light sensing sensor or a thermal sensing sensor. The optical element ES may detect an external object received through the front side or provide a sound signal such as voice through the front side to the outside. The optical element ES may include multiple configurations, and is not limited to any one embodiment.

Referring back to FIG. 2, the housing HM may be combined with the cover window WU. The cover window WU may be disposed in front of the housing HM. The housing HM may be combined with the cover window WU to provide an accommodation space. The display panel DP and optical element ES may be accommodated in the accommodation space provided between the housing HM and the cover window WU.

The housing HM may contain a material with relatively high stiffness. For example, the housing HM may include multiple frames and/or plates made of glass, plastic, metal, or a combination thereof. The housing HM may reliably protect the components of the display device 1000 in the inner space from external impact.

Figure 4:
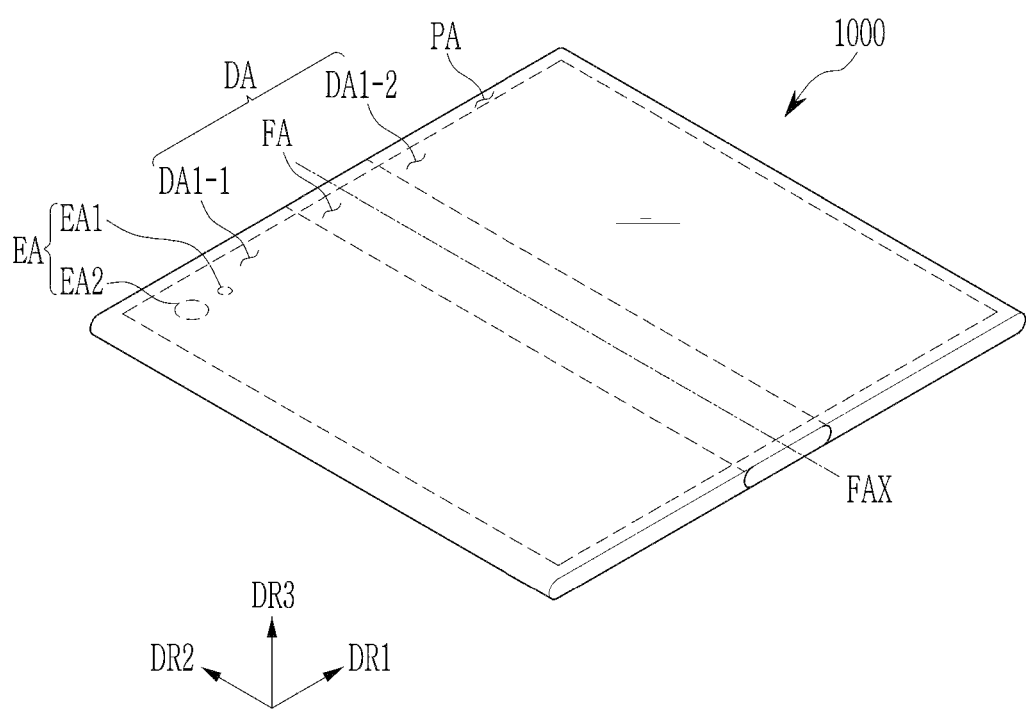
FIG. 4 is a schematic perspective view of a display device according to an embodiment.

Hereinafter, a structure of a display device 1000 according to an embodiment will be described with reference to FIG. 4. FIG. 4 is a schematic perspective view of a display device according to an embodiment. A description of the above-described constituent element and the same configuration will be omitted.

In the embodiment of FIG. 4, a foldable display device with a structure in which a display device 1000 may be folded along a folding axis FAX is illustrated.

Referring to FIG. 4, the display device 1000 may be a foldable display device. The display device 1000 may be folded outward or inward with reference to the folding axis FAX. In case folded outward with reference to the folding axis FAX, a display plane of the display device 1000 may be positioned outward in the third direction DR3, and thus images may be displayed in both directions. In case folded inward with reference to the folding axis FAX, the display plane may not be visible from the outside.

In the embodiment, the display device 1000 may include a display area DA, an element area EA, and a peripheral area PA. The display area DA may be divided into a 1-1 display area DA1-1, a 1-2 display area DA1-2, and a folding area FA. The 1-1 display area DA1-1 and the 1-2 display area DA1-2 may be positioned on the left and right sides of the folding axis FAX as a reference (or at the center), respectively, and the folding area FA may be positioned between the 1-1 display area DA1-1 and the 1-2 the display areas DA1-2. In case that the display device 100 is folded outward with reference to the folding axis FAX, the 1-1 display area DA1-1 and the 1-2 display area DA1-2 may be positioned on both sides in the third direction DR3, and images may be displayed in both directions. In case that the display device 100 is folded inward with reference to the folding axis FAX, the 1-1 display area DA1-1 and the 1-2 display area DA1-2 may not be visible from the outside.

Figure 5:
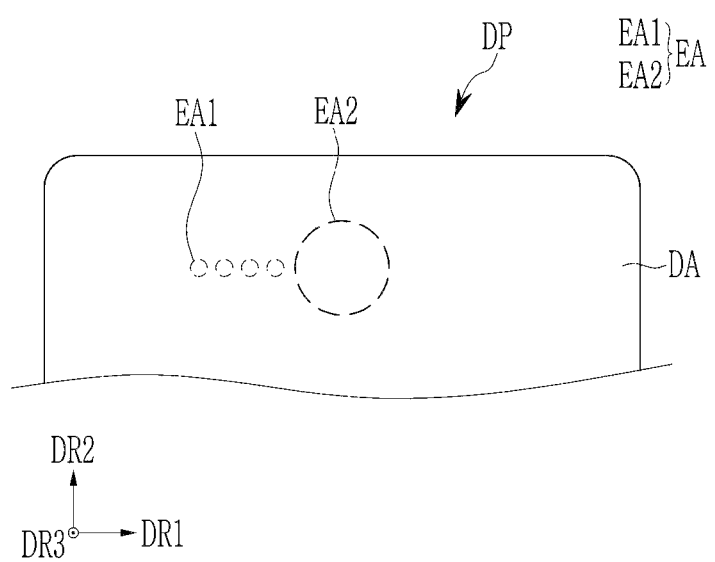
FIG. 5 is an enlarged top plan view of some area of the light emitting display device according to an embodiment.

FIG. 5 is an enlarged top plan view of some area of the light emitting display device according to an embodiment.

FIG. 5 shows a part of the light emitting display panel DP of the light emitting display device according to an embodiment, and is illustrated using a display panel for a mobile phone.

The light emitting display panel DP may have a display area DA positioned on the front side, and may include the element area EA on the front side, and may include a first element area EA1 and a second element area EA2. In the embodiment of FIG. 5, the first element area EA1 may be positioned at a portion adjacent to the second element area EA2. In the embodiment of FIG. 5, the first element area EA1 may be disposed at the left side of the second element area EA2. The position and the number of first element areas EA1 may vary depending on embodiments. In FIG. 5, an optical element corresponding to the second element area EA2 may be a camera, and an optical element corresponding to the first element area EA1 may be an optical sensor.

The display area DA may include multiple light emitting diodes, and multiple pixel circuit portions for generating and transmitting a light emitting current, formed in each of the multiple light emitting diodes. Here, one light emitting diode and one pixel circuit portion may be referred to as a pixel PX. In the display area DA, one pixel circuit portion and one light emitting diode may be formed one-to-one. The display area DA is hereinafter also referred to as a normal display area. In FIG. 5, a structure of the light emitting display panel DP under the cut line is not shown, but the display area DA may be positioned under the cut line.

The first element area EA1 may be formed of only a transparent layer to allow light to pass through, may not include a conductive layer or semiconductor layer, and may have an optic sensor region OPS in a lower panel layer, and an opening (hereinafter, also referred to as an additional opening) is formed in a position corresponding to the first element area EA1 in a black pixel defining layer 380 in the upper panel layer, a blocking layer 220, and a color filter 230, thereby preventing light from being blocked. On the other hand, even though the optic sensor region OPS is positioned on the lower panel layer, it may be the display area DA rather than the first element area EA1 in case there is no opening corresponding to the upper panel layer. In FIG. 11 to FIG. 21, which will be described later, one pixel and one optic sensor region OPS are illustrated such that a pixel structure of the first element area EA1 or the display area DA may be illustrated.

The light emitting display panel DP according to the embodiment may be divided into a lower panel layer and an upper panel layer. The lower panel layer may be a portion where a light emitting diode and a pixel circuit portion constituting the pixel are positioned, and may include an encapsulation layer (refer to 400 of FIG. 24) that covers the lower panel layer. For example, the lower panel layer may include an anode, a black pixel defining layer 380 (refer to FIG. 24), a light emitting layer EML (refer to FIG. 24), a spacer 385 (refer to FIG. 24), a function layer FL (refer to FIG. 24), a cathode Cathode (refer to FIG. 24) from a substrate 110 (refer to FIG. 24) to the encapsulation layer, and may include an insulation layer, a semiconductor layer, and a conductive layer between the substrate and the anode. The upper panel layer may be a portion positioned in an upper portion of the encapsulation layer, and may include sensing insulation layers (refer to 501, 510, and 511 in FIG. 24) that may detect a touch and multiple sensing electrodes (refer to 540 and 541 in FIG. 24), and a light blocking layer (refer to 220 in FIG. 24), a color filter (refer to 230 in FIG. 24), and a planarization layer (refer to 550 in FIG. 24), and the like.

A structure of the lower panel layer of the display area DA will be described later with reference to FIG. 11 to FIG. 22.

Although it is not illustrated in FIG. 5, a peripheral area may be further positioned outside of the display area DA. Although a display panel DP for a mobile phone is illustrated in FIG. 5, the embodiment may be applied to a display panel where an optical element can be positioned on the back side of the display panel, and may also be a flexible display device. In the case of a foldable display device among flexible display devices, the positions of the second element area EA2 and the first element area EA1 may be different from the positions shown in FIG. 5.

Hereinafter, referring to FIG. 6 to FIG. 9, a structure of the anode Anode and a relationship with peripheral constituent elements according to an embodiment will be described through a top plan view and a schematic cross-sectional view.

First, referring to FIG. 6 and FIG. 7, a structure of the anode Anode and a relationship with the black pixel defining layer 380 positioned in the lower panel layer will be described in detail.

Figure 6:
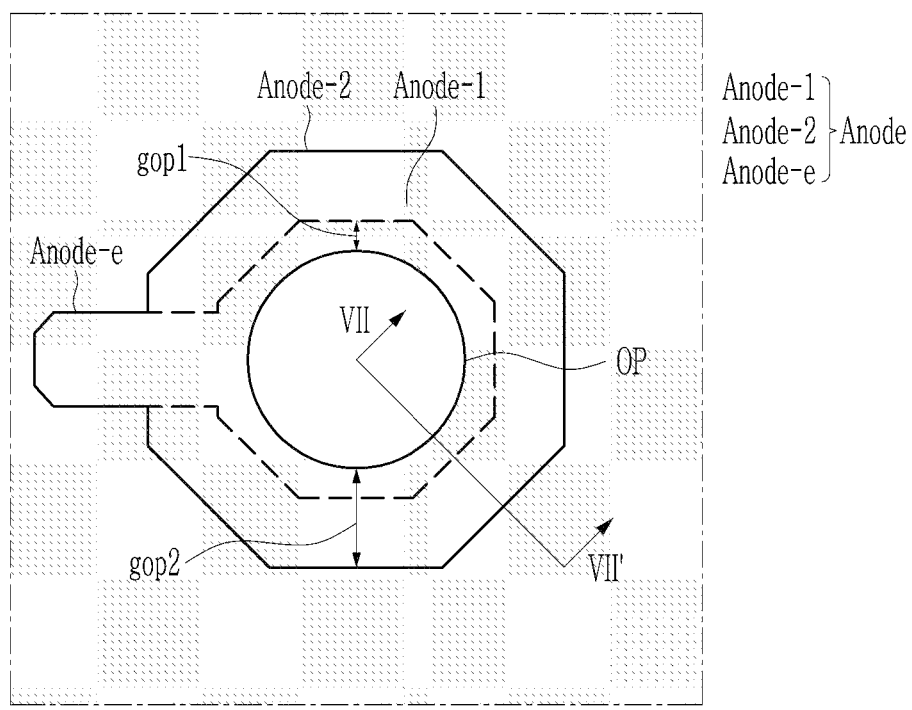
FIG. 6 is a top plan view illustrating a structure of an anode and a relationship with an opening of the black pixel defining layer.
Figure 7:
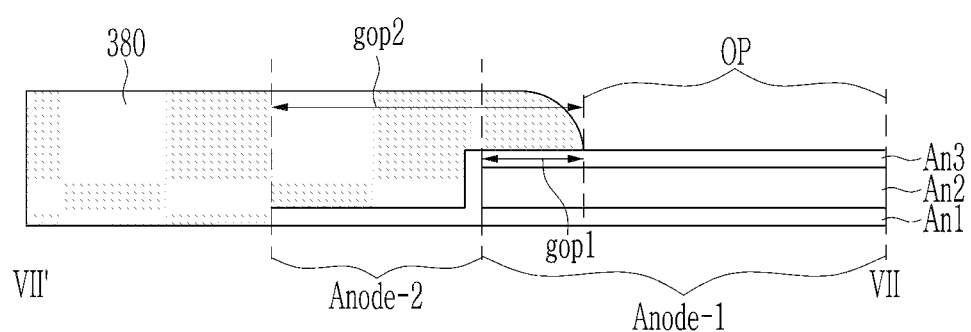
FIG. 7 is a schematic cross-sectional view of FIG. 6, taken along line VII-VII'.

FIG. 6 is a top plan view illustrating a structure of the anode and a relationship with an opening of the black pixel defining layer 380, and FIG. 7 is a schematic cross-sectional view of FIG. 6, taken along line VII-VII'.

First, a structure of the anode Anode will now be described with reference to FIG. 6 and FIG. 7.

The anode Anode may include an anode center portion Anode-1, an anode peripheral portion Anode-2, and an extension portion Anode-e extended from the anode center portion Anode-1.

The anode center portion Anode-1 may have a triple layer structure An1, An2, and An3, a lower layer An1 and an upper layer An3 may be formed of a transparent conductive material, and a middle layer An2 may be formed of a metallic material that can reflect light. Here, the transparent conductive material included in the lower layer An1 and the upper layer An3 may include a transparent conductive oxide TCO such as an indium tin oxide (ITO) and an indium zinc oxide (IZO), and the metallic material included in the middle layer An2 may include silver (Ag), lithium (Li), calcium (Ca), aluminum (Al), magnesium (Mg), and gold (Au). Here, a thickness of the lower layer An1 may have a value of about 40 Å or more and about 80 Å or less, a thickness of the middle layer An2 may have a value of about 700 A or more and about 900 A or less, and a thickness of the upper layer An3 may have a value of about 40 Å or more and about 80 Å or less. Here, the thickness of the lower layer An1 and the upper layer An3 may be formed differently, and according to the embodiment, the lower layer An1 may be formed thicker than the upper layer An3. However, depending on embodiments, the thickness may be formed variously.

The anode peripheral portion Anode-2 may not include a metallic material capable of reflecting light, and in the embodiment of FIG. 6, it may be formed as a single layer with the upper layer An3. The anode peripheral portion Anode-2 may be formed wider than the anode center portion Anode-1 so as to cover the side surface of the anode center portion Anode-1 and may be formed to be wider.

The anode Anode may include the extension portion Anode-e extending from the anode center portion Anode-1, and the extension portion Anode-e may also be formed in a triple-layer structure like the anode center portion Anode-1. The extension portion Anode-e may have a structure extending to the outside of the anode peripheral portion Anode-2. The anode peripheral portion Anode-2 may have a structure covering a side surface of a portion of the extension portion Anode-e. The extension portion Anode-e may be extended in various structures to receive a current transmitted to an organic light emitting diode, and may have a structure to be electrically connected with an electrode (refer to an anode connection part ACM2 of FIG. 20, etc.) in a lower portion through an opening (refer to OP4 in FIG. 20, etc.).

Except for the extension portion Anode-e, the anode center portion Anode-1 and the anode peripheral portion Anode-2 may be formed to have a same shape, and each side of the anode center portion Anode-1 and each side of the anode peripheral portion Anode-2 may be parallel to each other and have a constant horizontal distance. However, depending on embodiments, the anode center portion Anode-1 and the anode peripheral portion Anode-2 may have different shapes, the distances between the sides may be different from each other, and may have a non-parallel structure.

Hereinafter, an embodiment in which the lower layer An1 and the upper layer An3 that form the anode Anode may be formed of an indium tin oxide (ITO), and the middle layer An2 may be formed of silver (Ag), will be described. However, the lower layer An1, the middle layer An2, and the upper layer An3 may include other materials.

In FIG. 6 and FIG. 7, a relationship between the anode Anode and the black pixel defining layer 380 is illustrated.

The black pixel defining layer 380 may be formed of an organic material with black color and thus light applied from the outside may not be reflected back to the outside. Depending on embodiments, it may include an organic material of a black color of a negative type, and may include a black color pigment.

Referring to FIG. 6, an opening OP (hereinafter, also referred to as an "anode exposing opening") of the black pixel defining layer 380 may have a structure that only overlaps the anode center portion Anode-1 in the anode Anode, and thus a portion of the anode Anode exposed by the anode exposing opening OP of the black pixel defining layer 380 may be the anode center portion Anode-1. A center of the anode center portion Anode-1 and a center of the anode exposing opening OP of the black pixel defining layer 380 may match or be adjacent to each other.

Since the anode center portion Anode-1 may have a triple-layered structure and may be a portion that reflects light by including the middle layer An2 that is formed of a metallic material capable of reflecting light, the anode center portion Anode-1 exposed through the anode exposing opening OP of the black pixel defining layer 380 may reflect the light applied from the outside of the display device back to the outside. In general, a portion where the black pixel defining layer 380 blocks external light from being reflected back to the outside, but a portion of the black pixel defining layer 380 adjacent to the anode exposing opening OP may be formed thin, and thus external light may not be completely blocked. In a case that the anode center portion Anode-1 is positioned at the lower portion, external light may be partially reflected back to the outside. As described, a portion where external light may be reflected is a portion where the black pixel defining layer 380 and the anode center portion Anode-1 overlap in FIG. 6 and FIG. 7, and has a gap of gop1 (hereinafter, also referred to as a gap between the opening of the black pixel defining layer and an end of the anode center). This portion may be adjacent to the anode exposing opening OP of the black pixel defining layer 380, and the black pixel defining layer 380 may not be formed thick enough, thereby causing external light reflection. The thinner the gap of gop1, the less the reflected portion, but in that case, there may be a drawback in that the portion where the black pixel defining layer 380 is thinly formed may be increased. In other words, in case that the black pixel defining layer 380 is formed at a high height around the opening OP, a width of the tapered portion may increase as much such that the area with a width below the sufficient thickness may also increase. To eliminate such a problem, in the embodiment, the gap of gop1 may be formed to be about 1 μm above or below from 2.5 μm, for example, about 1.5 μm or more and about 3.5 μm or less, and thus the black pixel defining layer 380 may overlap the anode center portion Anode-1 having a triple-layer structure around the opening OP. The black pixel defining layer 380 may be formed only on the triple layer anode center portion Anode-1 around the opening OP, thereby reducing the height of the black pixel defining layer 380. As a result, the width of the portion where the black pixel defining layer 380 is thinly formed may be reduced, and accordingly, a structure that reduces the width through which external light can be reflected among the black pixel defining layer 380 may be provided.

In the embodiment, the anode peripheral portion Anode-2 may be formed and thus a large portion of the anode Anode overlapping with the black pixel defining layer 380 may be formed to be the anode peripheral portion Anode-2.

Figure 27:
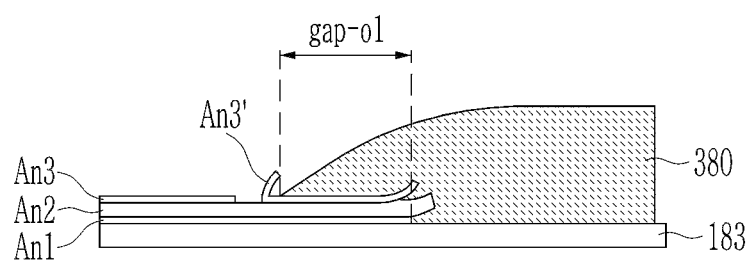
FIG. 27 and FIG. 28 show floating problems that may occur between an anode and a black pixel defining layer.

As described, as shown in FIG. 27, a problem (refer to An3' in FIG. 27) that the upper layer An3 of the anode Anode floats in the opening portion where the black pixel defining layer 380 is not formed occurs when an overlapping width between the black pixel defining layer 380 and the anode Anode is below a certain level, and thus the anode peripheral portion Anode-2 may be additionally formed to remove such floating problem and to improve the contact characteristic between the anode Anode and the black pixel defining layer 380.

Figure 28:
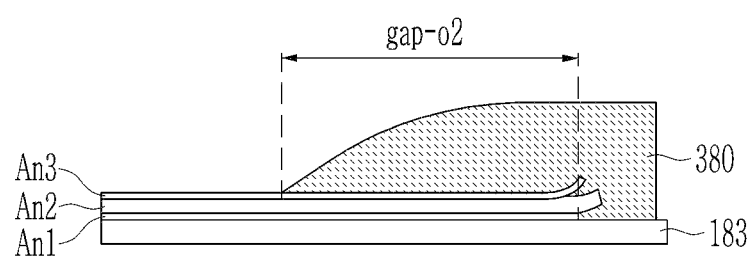

Referring to FIG. 28, it may be observed that when the black pixel defining layer 380 and the anode Anode overlap with a width of a certain level or more, the problem of floating does not occur in the anode exposing opening OP of the black pixel defining layer 380.

Based on this, in the embodiment, a gap gop2 where the black pixel defining layer 380 and the anode Anode overlap (also referred to as a gap between the opening of the black pixel defining layer and the end of the anode peripheral portion) may be formed to be about 2 μm above or below from 7.5 μm or 7.67 μm, for example, to be about 5.5 μm or more and about 9.5 μm or less such that the upper layer An3 of the anode Anode may not float in the anode exposing opening OP of the black pixel defining layer 380. Here, as a result of the experiment, it was confirmed that the upper layer An3 was not floated when the gap gop2 was formed to be about 7 μm, and it was confirmed that even when the gap gop2 was slightly narrower than this, the floating problem was not large and there was no effect on the display quality.

Although not shown in the drawing, the gap from one side of the anode center portion Anode-1 to one side of the anode peripheral portion Anode-2 may be about 2 μm or more and about 8 μm or less.

In such a structure, with reference to the upper layer An3 of the anode Anode, the upper layer An3 may be formed entirely on the upper part of the anode Anode, may cover the side surface of the middle layer An2, and may be additionally extended, and also may continuously contact the black pixel defining layer 380. The portion in contact with the black pixel defining layer 380 may include the entire anode peripheral portion Anode-2, a portion covering the side surface of the middle layer An2 as the boundary between the anode peripheral portion Anode-2 and the anode center portion Anode-1, and a gap portion gop1 as an upper portion of the anode center portion Anode-1.

With reference to such a structure shown in FIG. 6 and FIG. 7, the anode center portion Anode-1 of the anode Anode where external light is reflected may overlap the black pixel defining layer 380 with a width of about 1.5 μm to about 3.5 μm, and the anode center portion Anode-1 where external light is reflected may be positioned in a part of the region where the anode Anode and the black pixel defining layer 380 overlap. The anode peripheral portion Anode-2 formed of a transparent conductive material may be positioned in the remaining portion of the region where the black pixel defining layer 380 and the anode Anode overlap such that an overlapping width of the black pixel defining layer 380 and the anode Anode may be formed to be about 5.5 μm or more and about 9.5 μm or less. Thus, it is possible to remove the floating phenomenon between the black pixel defining layer 380 and the anode Anode. As a result, the display quality may be improved by reducing the reflectance of external light and removing the floating problem between the black pixel defining layer 380 and the anode Anode.

Hereinafter, referring to FIG. 8 and FIG. 9, a relationship between the anode Anode and the light blocking layer 220 and the color filter 230 positioned in the upper panel layer will be described in detail.

Figure 8:
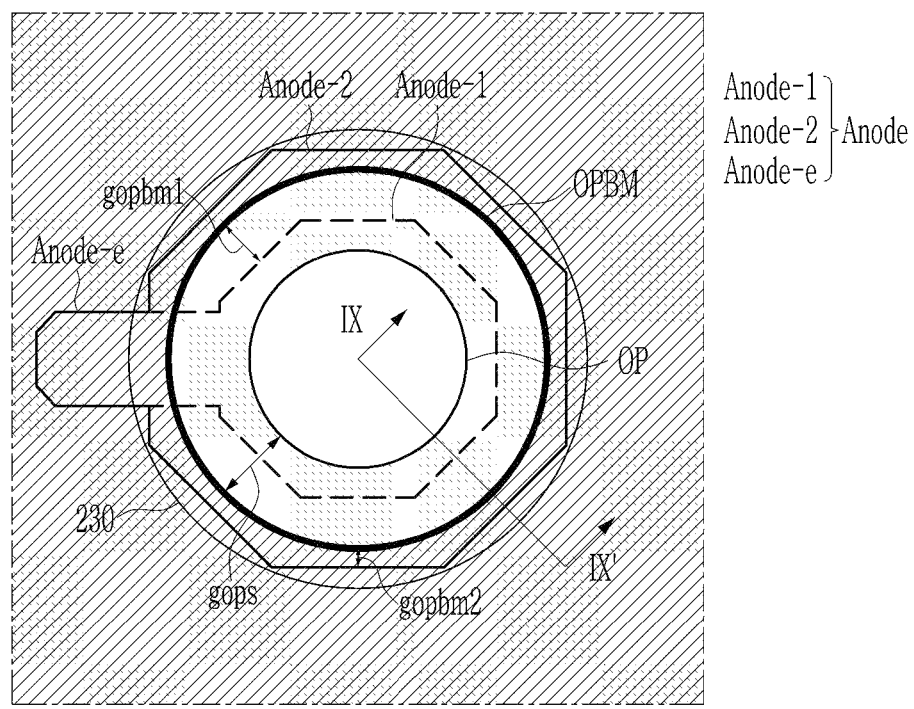
FIG. 8 is a top plan view illustrating a relationship between an opening of the light blocking layer and a color filter of FIG. 6.
Figure 9:
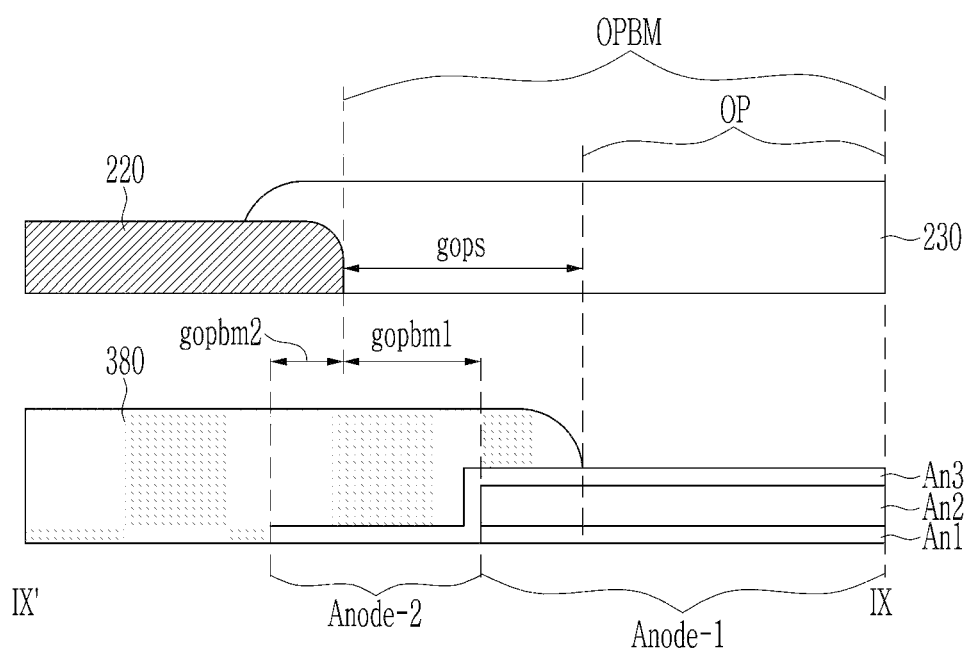
FIG. 9 is a schematic cross-sectional view of FIG. 7, taken along line IX-IX'.

FIG. 8 is a top plan view that further illustrates a relationship between the opening of the light blocking layer and the color filter in addition to FIG. 6, and FIG. 9 is a schematic cross-sectional view of FIG. 8, taken along line IX-IX'.

In FIG. 8 and FIG. 9, in addition to FIG. 6 and FIG. 7, a relationship between each portion (i.e., the anode center portion Anode-1 and the anode peripheral portion Anode-2) of the anode Anode and the anode exposing opening OP of the black pixel defining layer 380 is illustrated in more detail with reference to an opening OPBM (hereinafter, referred to as an opening for the color filter) of the light blocking layer 220.

First, the upper panel layer where the light blocking layer 220 and the color filter 230 are positioned will be described. The light blocking layer 220 may be formed of an organic material with a black color to prevent light applied from the outside from entering inside. However, the light blocking layer 220 may include the light blocking layer opening OPBM such that the light emitted from a light emitting diode of the lower panel layer may pass through the upper panel layer and may be provided to the user. The color filter 230 may be formed in the light blocking layer opening OPBM and thus the light emitted from the light emitting diode may have color. Referring to FIG. 8, a boundary of the color filter 230 may be positioned outside of a boundary of the light blocking layer opening OPBM.

The light blocking layer opening OPBM may overlap the anode exposing opening OP of the black pixel defining layer 380 in a plan view, and may be formed wider than the anode exposing opening OP of the black pixel defining layer 380. Spacing between the two openings is shown as the gap gops in FIG. 8 and FIG. 9. Depending on embodiments, the gap gops (hereinafter, also referred to as an interval between the light blocking layer opening OPBM and the anode exposing opening OP of the black pixel defining layer 380) may be formed to be about 1.5 μm above or below from 5.72 μm or 6.02 μm, for example, about 4.5 μm or more and about 7.5

μm or less. As described, the light blocking layer opening OPBM may be formed larger than the anode exposing opening OP of the black pixel defining layer 380, and a part of the black pixel defining layer 380 may be exposed by the light blocking layer opening OPBM.

A distance between the light blocking layer opening OPBM and the two parts of the anode Anode (anode center portion Anode-1 and anode peripheral portion Anode-2) may be as follows.

The region where the opening OPBM of the light blocking layer 220 and the anode center portion Anode-1 overlap may have a gap gopbm1 (hereinafter, also referred to as a gap between the light blocking layer opening and an end of the anode center portion), and the region where the light blocking layer 220 and the anode peripheral portion Anode-2 may have a gap gopbm2 (hereinafter, also referred to as a gap between the opening of the light blocking layer and an end of the anode peripheral portion).

Here, the gap gopbm2 may be about 0.5 μm above or below from 1.65 μm, for example, about 1.0 μm or more and about 2.0 μm or less, the gap gopbm1 may be larger than the gap gopbm2, and may be formed to be about 3.5 μm or more and about 8.5 μm or less.

Hereinafter, the circuit structure of the pixel positioned on the lower panel layer of the light emitting display panel DP will be described in more detail with reference to FIG. 10.

The following pixel structure may be a pixel structure of the display area DA and/or the second element area EA2 including the optical sensor region OPS. Here, the optical sensor region OPS may be a part that may correspond to the first element area EA1 in case that a light blocking portion such as a light blocking layer is removed from the upper part, and when light is blocked with a light blocking layer on the upper part of the optical sensor region OPS, it may be included in the display area DA.

First, a circuit structure of the pixel will be described with reference to FIG. 10.

Figure 10:
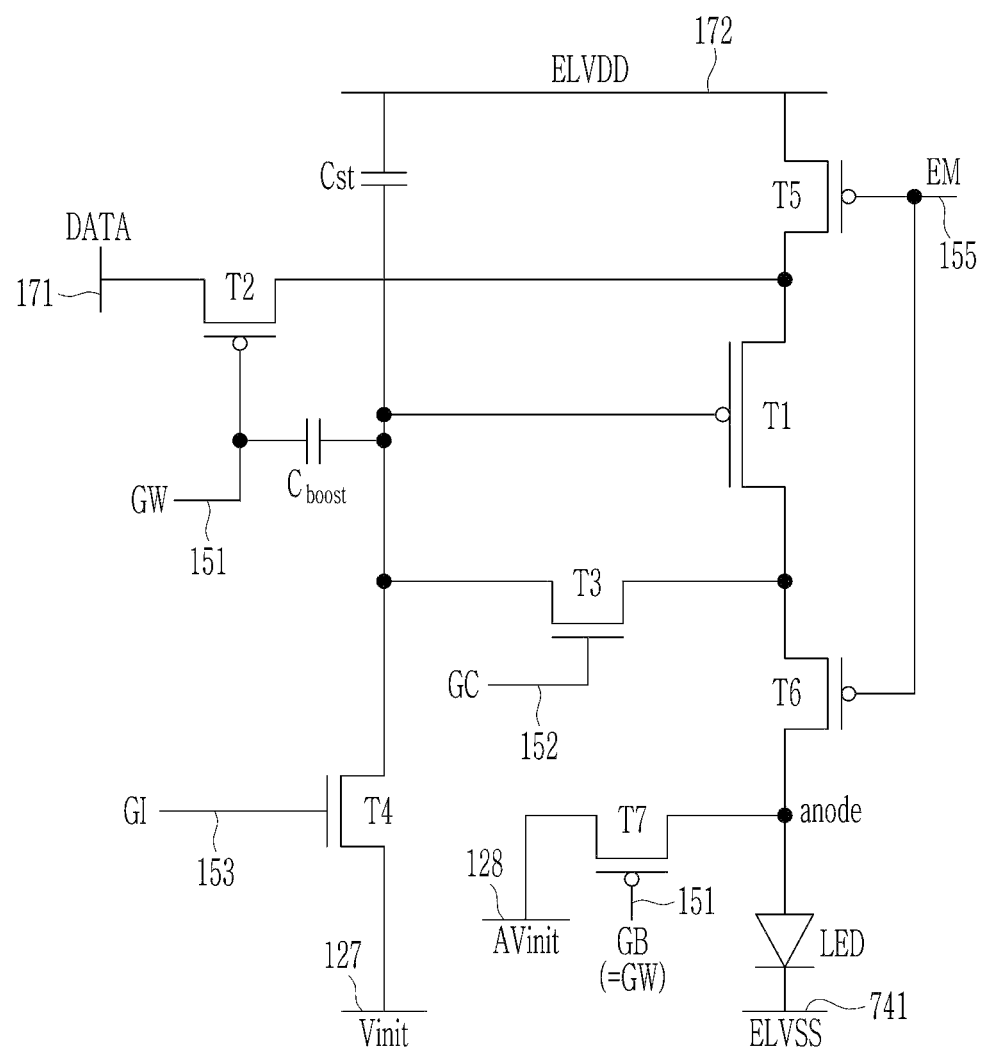
FIG. 10 is a schematic circuit diagram of a pixel included in the light emitting display device according to an embodiment.

FIG. 10 is a schematic circuit diagram of a pixel included in the light emitting display device according to an embodiment.

A circuit structure shown in FIG. 10 is a circuit structure of a pixel circuit portion and a light emitting diode formed in the display area DA and the second element area EA2.

A pixel according to the embodiment may include multiple transistors T1, T2, T3, T4, T5, T6, and T7 electrically connected to multiple wires 127, 128, 151, 152, 153, 155, 171, 172, and 741, a storage capacitor Cst, a boost capacitor $C_{boost}$, and a light emitting diode LED. Here, transistors and capacitors except for light emitting diode LED may form the pixel circuit portion. Depending on embodiments, the boost capacitor $C_{boost}$ may be omitted.

A single pixel PX may be electrically connected to the multiple wires 127, 128, 151, 152, 153, 155, 171, 172, and 741. The multiple wires may include a first initialization voltage line 127, a second initialization voltage line 128, a first scan line 151, a second scan line 152, an initialization control line 153, a light emission control line 155, a data line 171, a driving voltage line 172, and a common voltage line 741. The first scan line 151 connected to a seventh transistor T7 may be also electrically connected to a second transistor T2, but according to an embodiment, the seventh transistor T7 may be electrically connected to a separate bypass control line unlike the second transistor T2.

The first scan line 151 may be electrically connected to a scan driver (not shown) and may transmit a first scan signal GW to the second transistor T2 and the seventh transistor T7. A voltage applied to the first scan line 151 and a voltage of opposite polarity may be applied to the second scan line 152 at the same timing as the signal of the first scan line 151. For example, in case that a negative voltage is applied to the first scan line 151, a positive voltage may be applied to the second scan line 152. The second scan line 152 may transmit the second scan signal GC to the third transistor T3. The initialization control line 153 may transmit an initialization control signal GI to a fourth transistor T4. The light emission control line 155 may transmit a light emission control signal EM to a fifth transistor T5 and a sixth transistor T6.

The data line 171 may be a wire that transmits a data voltage DATA generated by a data driver (not shown). Accordingly, the intensity of the light emitting current transmitted to the light emitting diode LED may change, and thus luminance of the light emitting diode LED may also change. The driving voltage line 172 may transmit a driving voltage ELVDD. The first initialization voltage line 127 may transmit the first initialization voltage Vinit, and the second initialization voltage line 128 may transmit the second initialization voltage AVinit. The common voltage line 741 may transmit a common voltage ELVSS to a cathode of the light emitting diode LED. In the embodiment, voltages applied to the driving voltage line 172, the first and second initialization voltage lines 127 and 128, and the common voltage line 741 may each be a constant voltage.

A driving transistor T1 (also called a first transistor) may be a P-type transistor, and may have a silicon semiconductor as a semiconductor layer. The driving transistor T1 may be a transistor that may adjust intensity of a light emitting current output to an anode of the light emitting diode LED according to intensity of a gate electrode voltage (i.e., a voltage stored in the storage capacitor Cst) of the driving transistor T1. Since the brightness of the light emitting diode LED may be adjusted according to the intensity of the light emitting current output to the anode of the light emitting diode LED, the luminance of the light emitted from the light emitting diode LED may be adjusted according to the data voltage DATA applied to the pixel. For this purpose, a first electrode of the driving transistor T1 may be disposed to receive the driving voltage ELVDD, and may be electrically connected to the driving voltage line 172 via the fifth transistor T5. The first electrode of the driving transistor T1 may be also electrically connected to a second electrode of the second transistor T2 to receive the data voltage DATA. The second electrode of the driving transistor T1 may output a light emitting current to the light emitting diode LED and may be electrically connected to the anode of the light emitting diode LED via the sixth transistor T6 (hereinafter, referred to as an output control transistor). The second electrode of the driving transistor T1 may also be electrically connected to the third transistor T3, and the data voltage DATA applied to the first electrode may be transferred to the third transistor T3. The gate electrode of the driving transistor T1 may be electrically connected to one electrode (hereinafter, referred to as a second storage electrode) of the storage capacitor Cst. Accordingly, the voltage of the gate electrode of the driving transistor T1 may change according to the voltage stored in the storage capacitor Cst, and accordingly, the light emitting current output by the driving transistor T1 may be changed. The storage capacitor Cst may serve to keep the voltage of the gate electrode of the driving transistor T1 constant for one frame. The gate electrode of the driving transistor T1 may also be electrically connected to the third transistor T3 and thus the data voltage DATA applied to the first electrode of the driving transistor T1 may be transmitted to the gate electrode of the driving transistor T1 through the third transistor T3. The gate electrode of the driving transistor T1 may also be electrically connected to the fourth transistor T4 and may be initialized by receiving the first initialization voltage Vinit.

The second transistor T2 may be a P-type transistor and may have a silicon semiconductor as a semiconductor layer. The second transistor T2 may be a transistor that receives the data voltage DATA into the pixel. A gate electrode of the second transistor T2 may be electrically connected to the first scan line 151 and one electrode (hereinafter, referred to as a lower boost electrode) of a boost capacitor $C_{boost}$. A first electrode of the second transistor T2 may be electrically connected to the data line 171. A second electrode of the second transistor T2 may be electrically connected to the first electrode of the driving transistor T1. In case that the second transistor T2 is turned on by the negative voltage of the first scan signal GW transmitted through the first scan line 151, a data voltage DATA transferred through the data line 171 may be transmitted to the first electrode of the driving transistor T1, and finally, the data voltage DATA may be transmitted to the gate electrode of the driving transistor T1 and stored in the storage capacitor Cst.

The third transistor T3 may be an N-type transistor and may have an oxide semiconductor as a semiconductor layer. The third transistor T3 may electrically connect the second electrode of the driving transistor T1 and the gate electrode of the driving transistor T1. As a result, the data voltage DATA may be compensated by a threshold voltage of the driving transistor T1 and then stored in the second storage electrode of the storage capacitor Cst. A gate electrode of the third transistor T3 may be electrically connected to the second scan line 152, and the first electrode of the third transistor T3 may be electrically connected to the second electrode of the driving transistor T1. A second electrode of the third transistor T3 may be electrically connected to the second sustain electrode of the storage capacitor Cst, the gate electrode of the driving transistor T1, and the other electrode of the boost capacitor $C_{boost}$ (hereinafter referred to as an upper boost electrode). The third transistor T3 may be turned on by the positive voltage of the second scan signal GC received through the second scan line 152, and may connect the gate electrode of the driving transistor T1 and the second electrode of the driving transistor T1, and may transmit the voltage applied to the gate electrode of the driving transistor T1 to the second sustain electrode of the storage capacitor Cst and may store in the storage capacitor Cst. The voltage stored in the storage capacitor Cst may be stored in a state in which the voltage of the gate electrode of the driving transistor T1 in case that the driving transistor T1 is turned off may be stored and thus a threshold voltage Vth of the driving transistor T1 may be compensated.

The fourth transistor T4 may be an N-type transistor and may have an oxide semiconductor as a semiconductor layer. The fourth transistor T4 may initialize the gate electrode of the driving transistor T1 and the second storage electrode of the storage capacitor Cst. A gate electrode of the fourth transistor T4 may be electrically connected to the initialization control line 153, and a first electrode of the fourth transistor T4 may be electrically connected to the first initialization voltage line 127. A second electrode of the fourth transistor T4 may be electrically connected to the second electrode of the third transistor T3, the second storage electrode of the storage capacitor Cst, the gate electrode of the driving transistor T1, and the upper boost electrode of the boost capacitor $C_{boost}$. The fourth transistor T4 may be turned on by the positive voltage of the initialization control signal GI received through the initialization control line 153, and the first initialization voltage Vinit may be applied to the gate electrode of the driving transistor T1, the second sustain electrode of the storage capacitor Cst, and the upper boost electrode of the boost capacitor $C_{boost}$ for initialization.

The fifth transistor T5 and the sixth transistor T6 may be P-type transistors, and may have a silicon semiconductor as a semiconductor layer.

The fifth transistor T5 may serve to transfer the driving voltage ELVDD to the driving transistor T1. A gate electrode of the fifth transistor T5 may be electrically connected to the light emission control line 155, a first electrode of the fifth transistor T5 may be electrically connected to the driving voltage line 172, and a second electrode of the fifth transistor T5 may be electrically connected to the first electrode of the driving transistor T1.

The sixth transistor T6 may serve to transfer the light emitting current output from the driving transistor T1 to the light emitting diode LED. A gate electrode of the sixth transistor T6 may be electrically connected to the light emission control line 155, a first electrode of the sixth transistor T6 may be electrically connected to the second electrode of the driving transistor T1, and a second electrode of the sixth transistor T6 may be electrically connected to the anode of the light emitting diode LED.

The seventh transistor T7 may be a P-type or N-type transistor, and may have a silicon semiconductor or an oxide semiconductor as a semiconductor layer. The seventh transistor T7 may initialize the anode of the light emitting diode LED. A gate electrode of seventh transistor T7 may be electrically connected to the first scan line 151, a first electrode of seventh transistor T7 may be electrically connected to the anode of light emitting diode LED, and a second electrode of seventh transistor T7 may be electrically connected to the second initialization voltage line 128. In case that the seventh transistor T7 is turned on by a negative voltage of the first scan line 151, the second initialization voltage AVinit may be applied to the anode of the light emitting diode LED and may be initialized. On the other hand, the gate electrode of the seventh transistor T7 may be electrically connected to a separate bypass control line and may be controlled by a separate wire from the first scan line 151. Depending on embodiments, the second initialization voltage line 128 to which the second initialization voltage AVinit is applied may be the same as the first initialization voltage line 127 to which the first initialization voltage Vinit is applied.

In the embodiment, one pixel PX may include seven transistors T1 to T7, two capacitors (storage capacitor Cst and boost capacitor $C_{boost}$), but this is not restrictive, and depending on embodiments, the boost capacitor $C_{boost}$ may be excluded. The third transistor and the fourth transistor may be N-type transistors, but only one of the two transistors may be formed as an N-type transistor or the other transistor may be formed as an N-type transistor. Depending on embodiments, all of the seven transistors T1 to T7 may be formed of P-type transistors.

Hereinabove, the circuit structure of the pixel formed in the display area DA has been described with reference to FIG. 10.

Hereinafter, a detailed planar structure and a stacked structure of the pixel formed in the display area DA will be described with reference to FIG. 11 to FIG. 24, and a pixel in the following embodiment may include an optic sensor area OPS.

First, a planar structure of each layer according to a manufacturing order will be described with reference to FIG. 11 to FIG. 23. A pixel structure shown in the drawing may be a pixel structure of the display area DA and/or the second element area EA2 including the optical sensor region OPS.

FIG. 11 to FIG. 23 are drawings specifically showing a structure of each layer according to the manufacturing order of the lower panel layer of the light emitting display device according to an embodiment.

Figure 11:
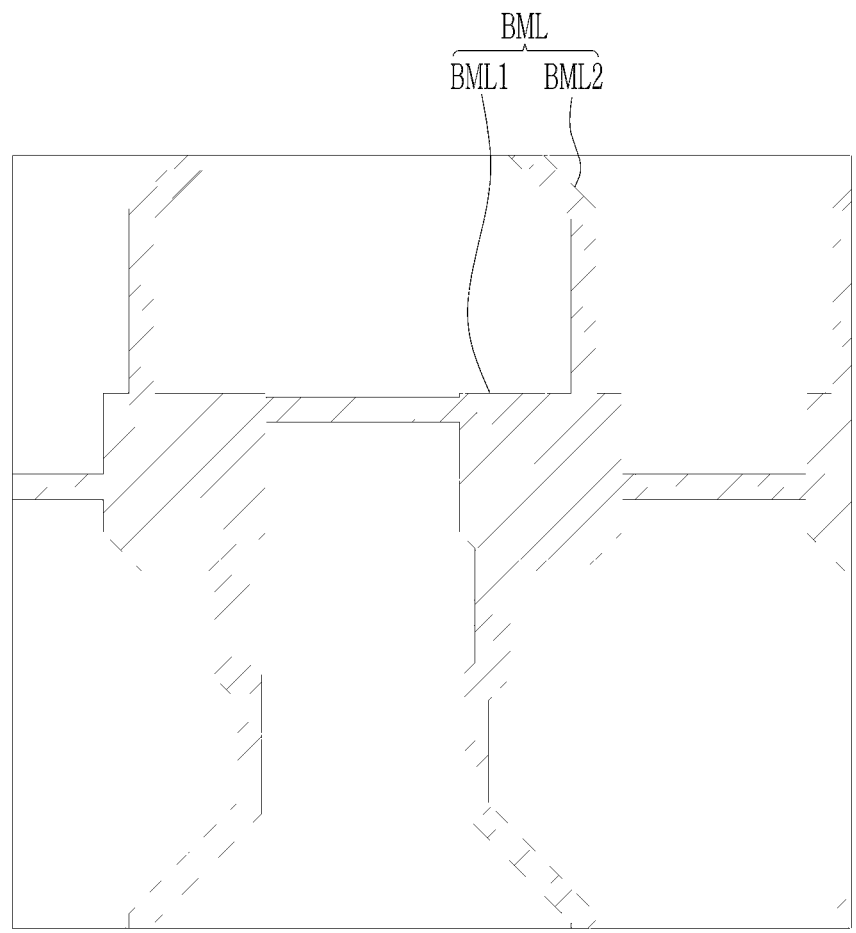
FIG. 11 to FIG. 23 are drawings showing a structure of each layer according to the manufacturing order of the lower panel layer of the light emitting display device according to an embodiment.

Referring to FIG. 11, a metal layer BML may be positioned on the substrate 110.

The substrate 110 may include a material that does not bend due to a rigid characteristic such as glass, or a flexible material that may be bent, such as plastic or polyimide. In the case of a flexible substrate, as shown in FIG. 24, the substrate 110 may have a double-layered structure of polyimide and a barrier layer formed of an inorganic insulating material thereon.

The metal layer BML may include multiple expansion portions BML1 and a connection portion BML2 electrically connecting the multiple expansion portions BML1 to each other. The expansion portion BML1 of the metal layer BML may be formed at a position overlapping a channel 1132 of the driving transistor T1 in a plan view in the subsequent first semiconductor layer. The metal layer BML may be also called a lower shielding layer, and may include a metal or a metal alloy such as one of copper (Cu), molybdenum (Mo), aluminum (Al), titanium (Ti), and amorphous silicon, and may be formed of a single layer or multiple layers.

Figure 24:
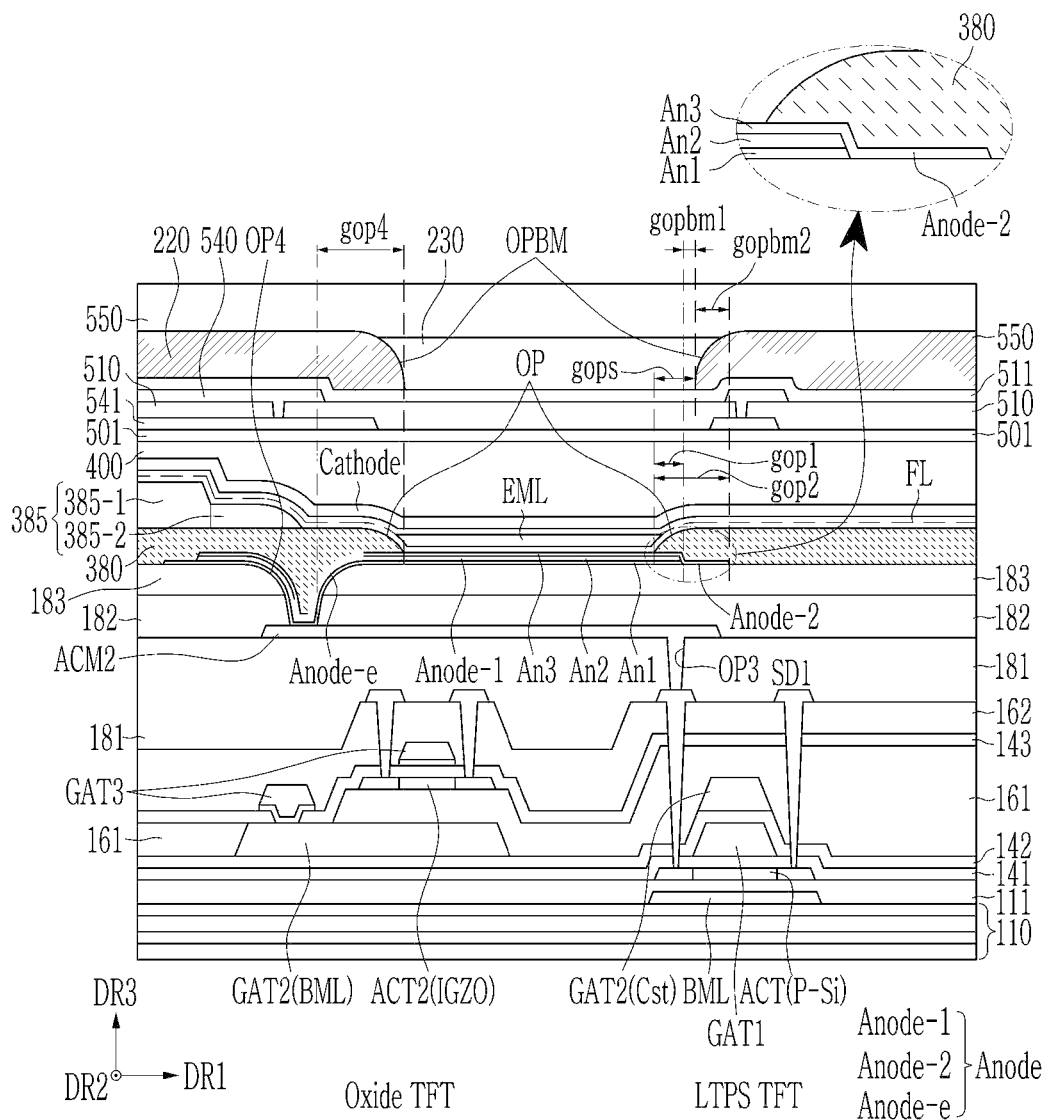
FIG. 24 is a schematic cross-sectional view of the light emitting display device according to an embodiment.

Referring to FIG. 24, a buffer layer 111 may be positioned on the substrate 110 and the metal layer BML to cover them. The buffer layer 111 may serve to block penetration of impurity elements into the first semiconductor layer 130, and may be an inorganic insulating layer including a silicon oxide (SiOx), a silicon nitride (SiNx), or a silicon oxynitride (SiOxNy).

Figure 12:
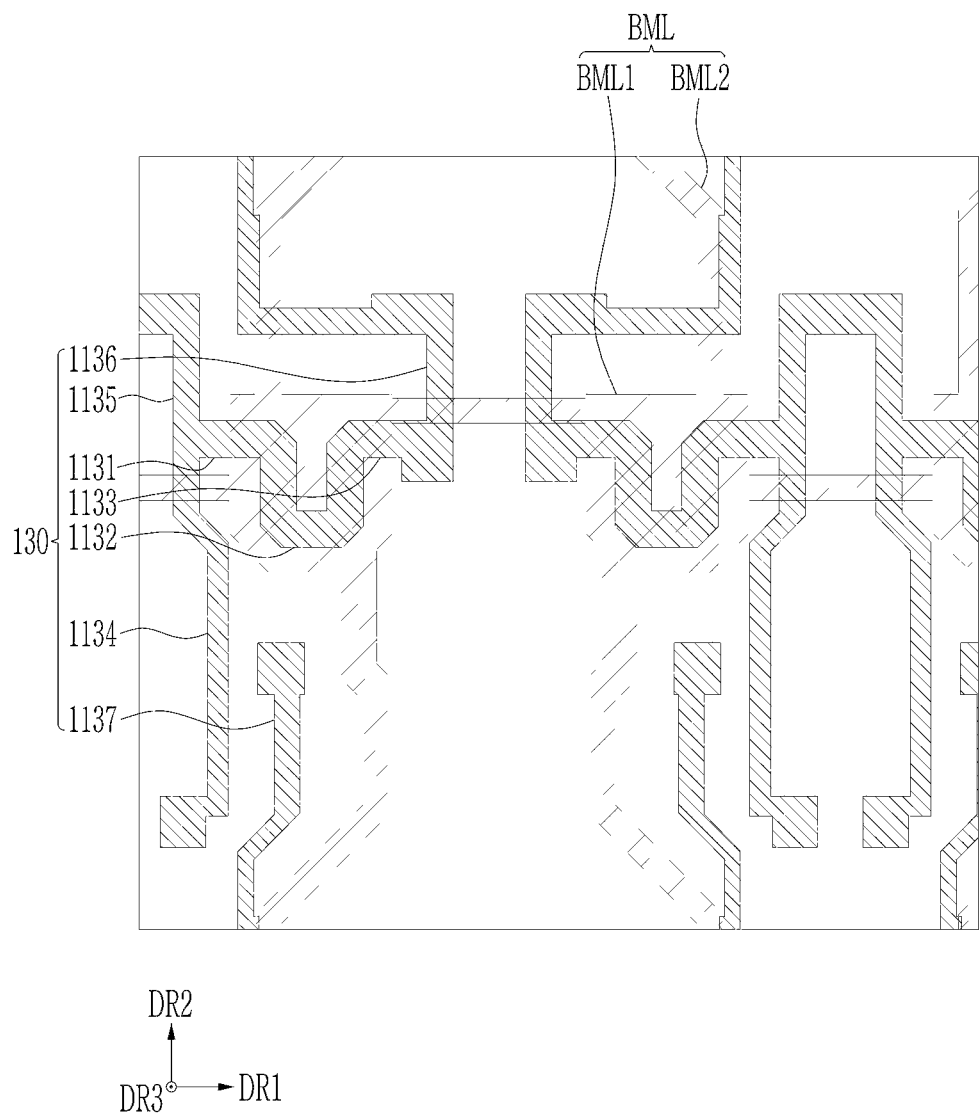

As shown in FIG. 12, a first semiconductor layer 130 formed of a silicon semiconductor (e.g., a polycrystalline semiconductor) may be positioned on the buffer layer 111. The first semiconductor layer 130 may include a channel 1132, a first region 1131, and a second region 1133 of the driving transistor T1. The first semiconductor layer 130 may include not only the channel of the driving transistor T1, but also channels of the second transistor T2, the fifth transistor T5, the sixth transistor T6, and the seventh transistor T7, and a region having a conductive layer characteristic may be provided on both sides of each channel by plasma treatment or doping to perform the role of the first electrode and the second electrode.

The channel 1132 of the driving transistor T1 may have a curved shape in a plan view. However, the shape of channel 1132 of the driving transistor T1 is not limited thereto, and may be variously changed. For example, the channel 1132 of the driving transistor T1 may be bent into a different shape or may have a bar shape. The first region 1131 and the second region 1133 of the driving transistor T1 may be positioned on both sides of the channel 1132 of the driving transistor T1. The first region 1131 and the second region 1133 positioned in the first semiconductor layer may serve as the first electrode and the second electrode of the driving transistor T1.

In the first semiconductor layer 130, a channel, a first region, and a second region of the second transistor T2 may be positioned in a portion 1134 extending downward from the first region 1131 of the driving transistor T1. A channel, a first region, and a second region of the fifth transistor T5 may be positioned in a portion 1135 extending upward from the first region 1131 of the driving transistor T1. A channel, a first region, and a second region of the sixth transistor T6 may be positioned in a portion 1136 extending upward from the second region 1133 of the driving transistor T1. A channel, a first region, and a second region of the seventh transistor T7 are positioned in a portion 1137 that is further extended while being bent from the portion 1136 of the first semiconductor layer 130.

Referring to FIG. 24, a first gate insulating layer 141 may be positioned on the first semiconductor layer 130 that includes the channel 1132, the first region 1131, and the second region 1133 of the driving transistor T1. The first gate insulating layer 141 may be an inorganic insulating layer including a silicon oxide (SiOx), a silicon nitride (SiNx), or a silicon oxynitride (SiOxNy).

Figure 13:
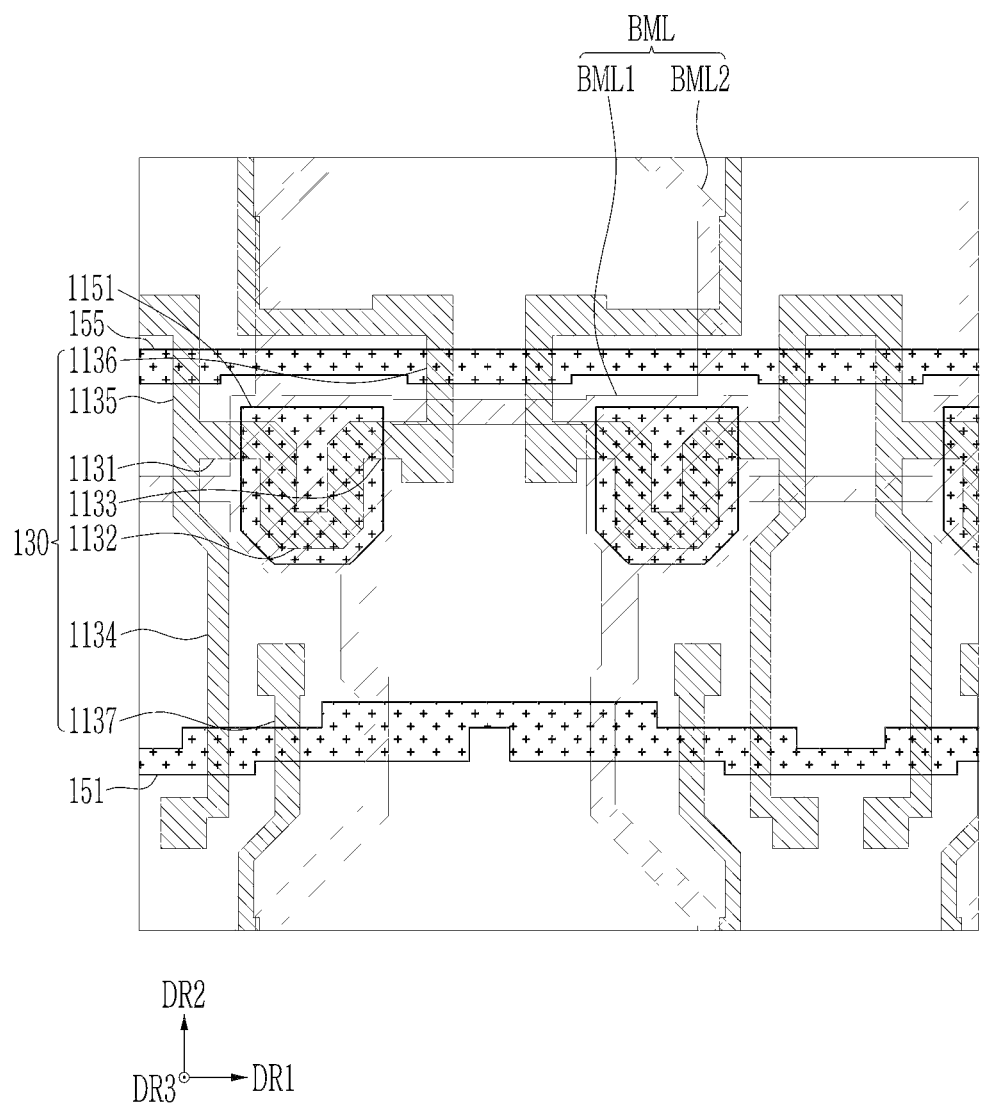

Referring to FIG. 13, a first gate conductive layer including the gate electrode 1151 of the driving transistor T1 may be positioned on the first gate insulating layer 141. The first gate conductive layer may include not only the gate electrode of the driving transistor T1, but also gate electrodes of the second transistor T2, the fifth transistor T5, the sixth transistor T6, and the seventh transistor T7. The gate electrode 1151 of the driving transistor T1 may overlap the channel 1132 of the driving transistor T1. The channel 1132 of the driving transistor T1 may be covered by the gate electrode 1151 of the driving transistor T1.

The first gate conductive layer may further include the first scan line 151 and the light emission control line 155. The first scan line 151 and the light emission control line 155 may extend in an approximately horizontal direction (hereinafter, also referred to as a first direction DR1). The first scan line 151 may be electrically connected to the gate electrode of the second transistor T2. The first scan line 151 may be formed integrally with the gate electrode of the second transistor T2. The first scan line 151 may also be electrically connected to the gate electrode of the seventh transistor T7 of a pixel in the next stage.

The light emission control line 155 may be electrically connected to the gate electrode of the fifth transistor T5 and the gate electrode of the sixth transistor T6, and the light emission control line 155 and the gate electrodes of the fifth transistor T5 and the sixth transistor T6 may be integrally formed.

The first gate conductive layer may include a metal such as copper (Cu), molybdenum (Mo), aluminum (Al), titanium (Ti), or a metal alloy thereof, and may be formed as a single layer or multiple layers.

After the first gate conductive layer including the gate electrode 1151 of the driving transistor T1 is formed, a plasma treatment or a doping process may be performed to make the exposed region of the first semiconductor layer conductive. For example, the first semiconductor layer covered by the first gate conductive layer may not be conductive, and a portion of the first semiconductor layer, not covered by the first gate conductive layer, may have the same characteristic as the conductive layer. The transistor including the conductive portion may have a P-type transistor characteristic, and thus the driving transistor T1, the second transistor T2, the fifth transistor T5, the sixth transistor T6, and the seventh transistor T7 may be P-type or N-type transistors.

Referring to FIG. 24, a second gate insulating layer 142 may be positioned on the first gate conductive layer including the gate electrode 1151 of the driving transistor T1 and the first gate insulating layer 141. The second gate insulating layer 142 may be an inorganic insulating layer including a silicon oxide (SiOx), a silicon nitride (SiNx), or a silicon oxynitride (SiOxNy).

Figure 14:
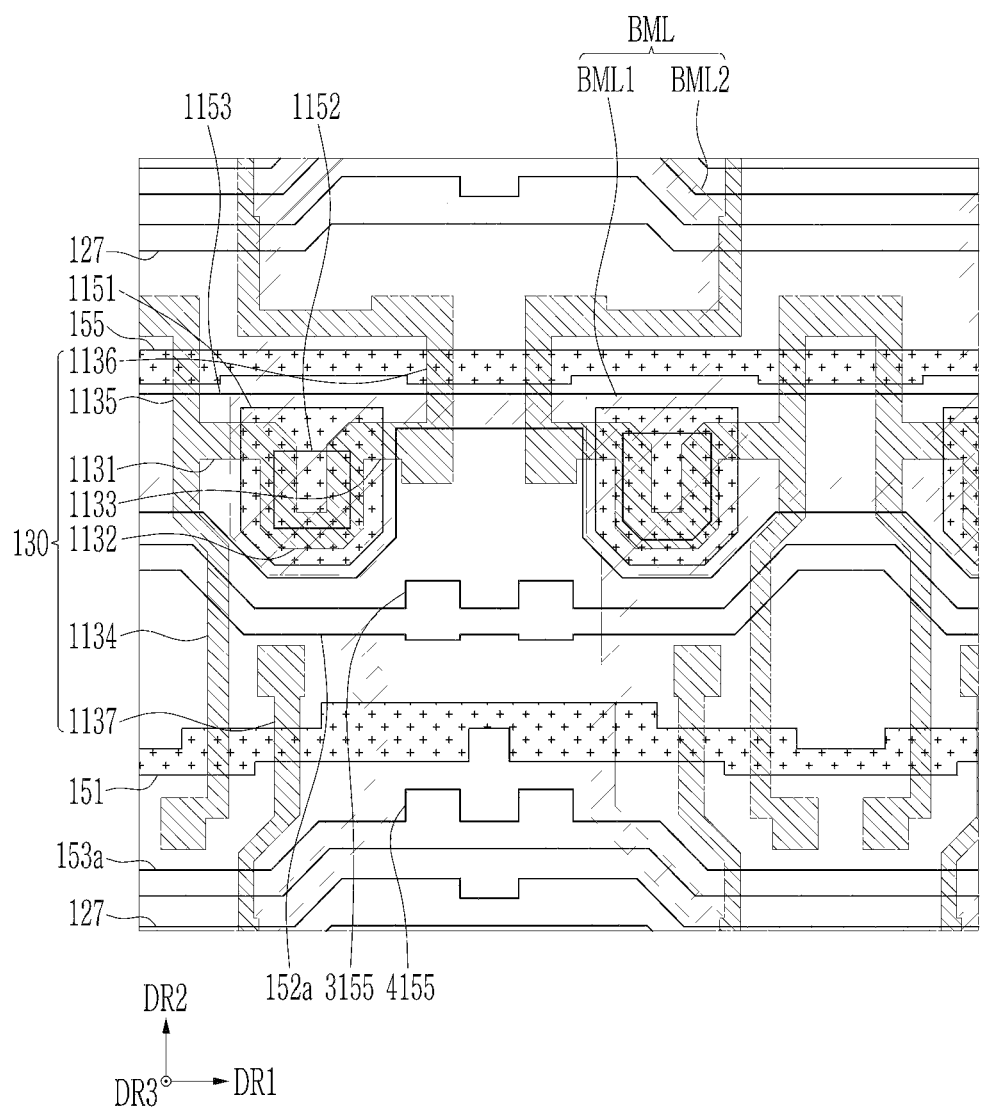

Referring to FIG. 14, a second gate conductive layer including the first sustain electrode 1153 of the storage capacitor Cst, the lower shielding layer 3155 of the third transistor T3, and the lower shielding layer 4155 of the fourth transistor T4 may be positioned on the second gate insulating layer 142. Each of the lower shielding layers 3155 and 4155 may be positioned under the channel of the third transistor T3 and the channel of the fourth transistor T4, respectively, and may serve to shield light or electromagnetic interference (EMI) provided to the channel from the lower side.

The first sustain electrode 1153 may overlap the gate electrode 1151 of the driving transistor T1 to form the storage capacitor Cst. An opening 1152 may be formed in the first sustain electrode 1153 of the storage capacitor Cst. The opening 1152 of the first sustain electrode 1153 of the storage capacitor Cst may overlap the gate electrode 1151 of the driving transistor T1. The first sustain electrode 1153 may extend in the horizontal direction (first direction DR1) and may be electrically connected to the adjacent first sustain electrode 1153.

A lower shielding layer 3155 of the third transistor T3 may overlap the channel 3137 and the gate electrode 3151 of the third transistor T3. A lower shielding layer 4155 of the fourth transistor T4 may overlap the channel 4137 and the gate electrode 4151 of the fourth transistor T4.

The second gate conductive layer may include a lower second scan line 152a, a lower initialization control line 153a, and a first initialization voltage line 127. The lower second scan line 152a, the lower initialization control line 153a, and the first initialization voltage line 127 may extend in an approximately horizontal direction (i.e., the first direction DR1). The lower second scan line 152a may be connected to the lower shielding layer 3155 of the third transistor T3. The lower second scan line 152a may be formed integrally with the lower shielding layer 3155 of the third transistor T3. The lower initialization control line 153a may be electrically connected to the lower shielding layer 4155 of the fourth transistor T4. The lower initialization control line 153a may be formed integrally with the lower shielding layer 4155 of the fourth transistor T4.

The second gate conductive layer GAT2 may include a metal such as copper (Cu), molybdenum (Mo), aluminum (Al), or titanium (Ti), or a metal alloy thereof, and may be configured as a single layer or multiple layers.

Referring to FIG. 24, a first interlayer insulating layer 161 may be positioned on the second gate conductive layer including the first sustain electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide (SiOx), a silicon nitride (SiNx), or silicon oxynitride (SiOxNy), and depending on embodiments, an inorganic insulating material may be thickly formed.

Figure 15:
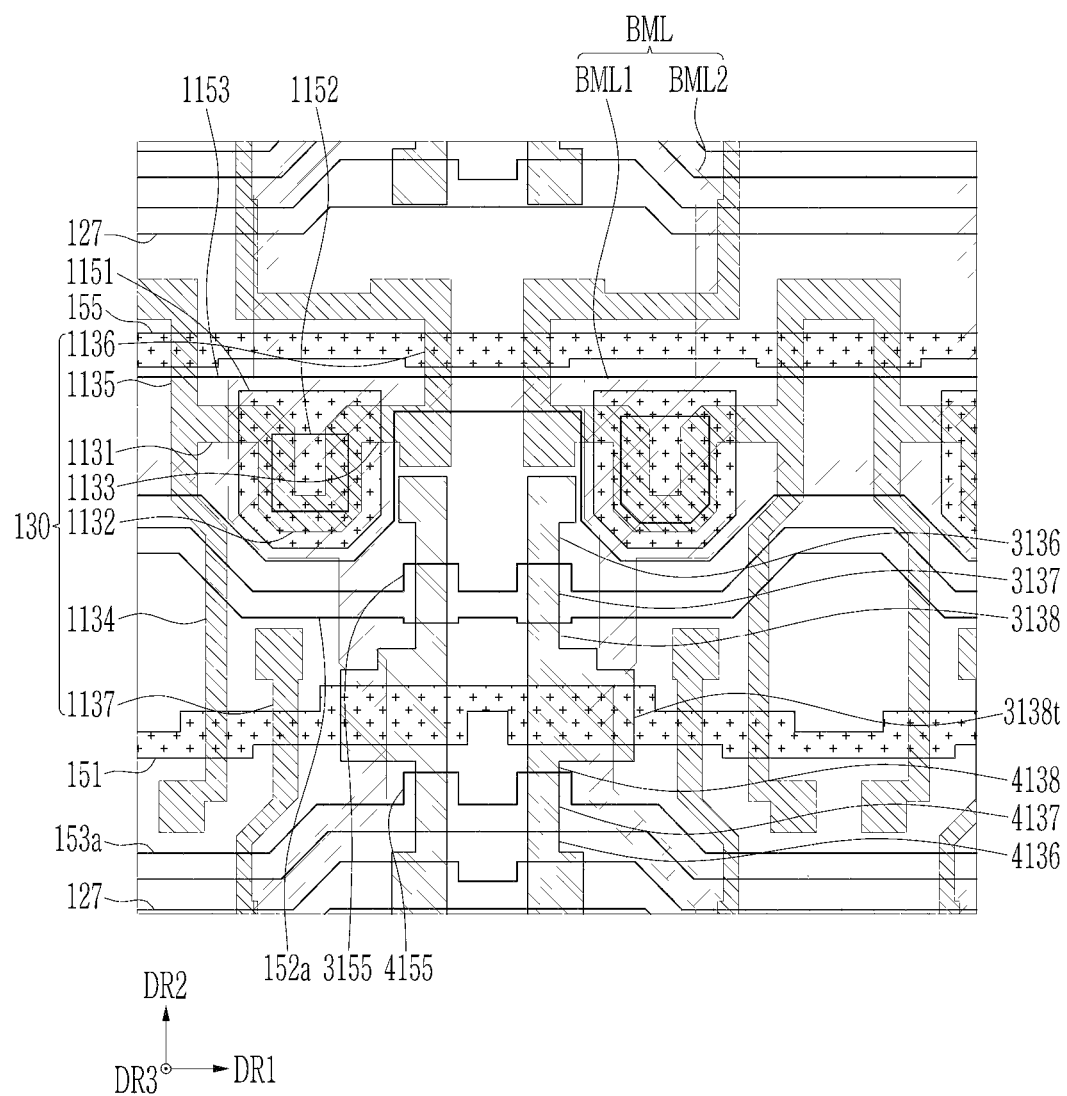

Referring to FIG. 15, an oxide semiconductor layer including the channel 3137, the first region 3136, and the second region 3138 of the third transistor T3 and the channel 4137, the first region 4136, and the second region 4138 of the fourth transistor T4 may be positioned on the first interlayer insulating layer 161. The oxide semiconductor layer may include an upper boost electrode 3138t of the boost capacitor $C_{boost}$.

The channel 3137, the first region 3136, and the second region 3138 of the third transistor T3, and the channel 4137, the first region 4136, and the second region 4138 of the fourth transistor T4 may be electrically connected to each other to form an integral body. The first region 3136 and the second region 3138 of the third transistor T3 may be positioned on both sides of the channel 3137 of the third transistor T3, and the first region 4136 and the second region 4138 of the fourth transistor T4 may be positioned on both sides of the channel 4137 of the fourth transistor T4. The second region 3138 of the third transistor T3 may be electrically connected to the second region 4138 of the fourth transistor T4. The channel 3137 of the third transistor T3 may overlap the lower shielding layer 3155, and the channel 4137 of the fourth transistor T4 may overlap the lower shielding layer 4155.

The upper boost electrode 3138t of a capacitor $C_{boost}$ may be positioned between the second region 3138 of the third transistor T3 and the second region 4138 of the fourth transistor T4. The upper boost electrode 3138t of the boost capacitor $C_{boost}$ may overlap the lower boost electrode 151a of the boost capacitor $C_{boost}$ to form the boost capacitor $C_{boost}$.

Referring to FIG. 24, a third gate insulating layer 143 may be positioned on the oxide semiconductor layer that includes the channel 3137, the first region 3136, and the second region 3138 of the third transistor T3, the channel 4137, the first region 4136, and the second region 4138 of the fourth transistor T4, and the upper boost electrode 3138t of the boost capacitor $C_{boost}$.

The third gate insulating layer 143 may be positioned on the entire surface of the oxide semiconductor layer and the first interlayer insulating layer 161. Thus, third gate insulating layer 143 may cover the channel 3137, the first region 3136, and the second region 3138 of the third transistor T3, the channel 4137, the first region 4136, and the second region 4138 of the fourth transistor T4, and a top surface and side surfaces of the upper boost electrode 3138t of the boost capacitor $C_{boost}$. However, the embodiment is not limited thereto, and the third gate insulating layer 143 may not be positioned on the entire oxide semiconductor layer and the first interlayer insulating layer 161. For example, the third gate insulating layer 143 may overlap the channel 3137 of the third transistor T3 and may not overlap the first region 3136 and the second region 3138. The third gate insulating layer 143 may overlap the channel 4137 of the fourth transistor T4 and may not overlap the first region 4136 and the second region 4138.

The third gate insulating layer 143 may include an inorganic insulating layer including a silicon oxide (SiOx), a silicon nitride (SiNx), or a silicon oxynitride (SiOxNy).

Figure 16:
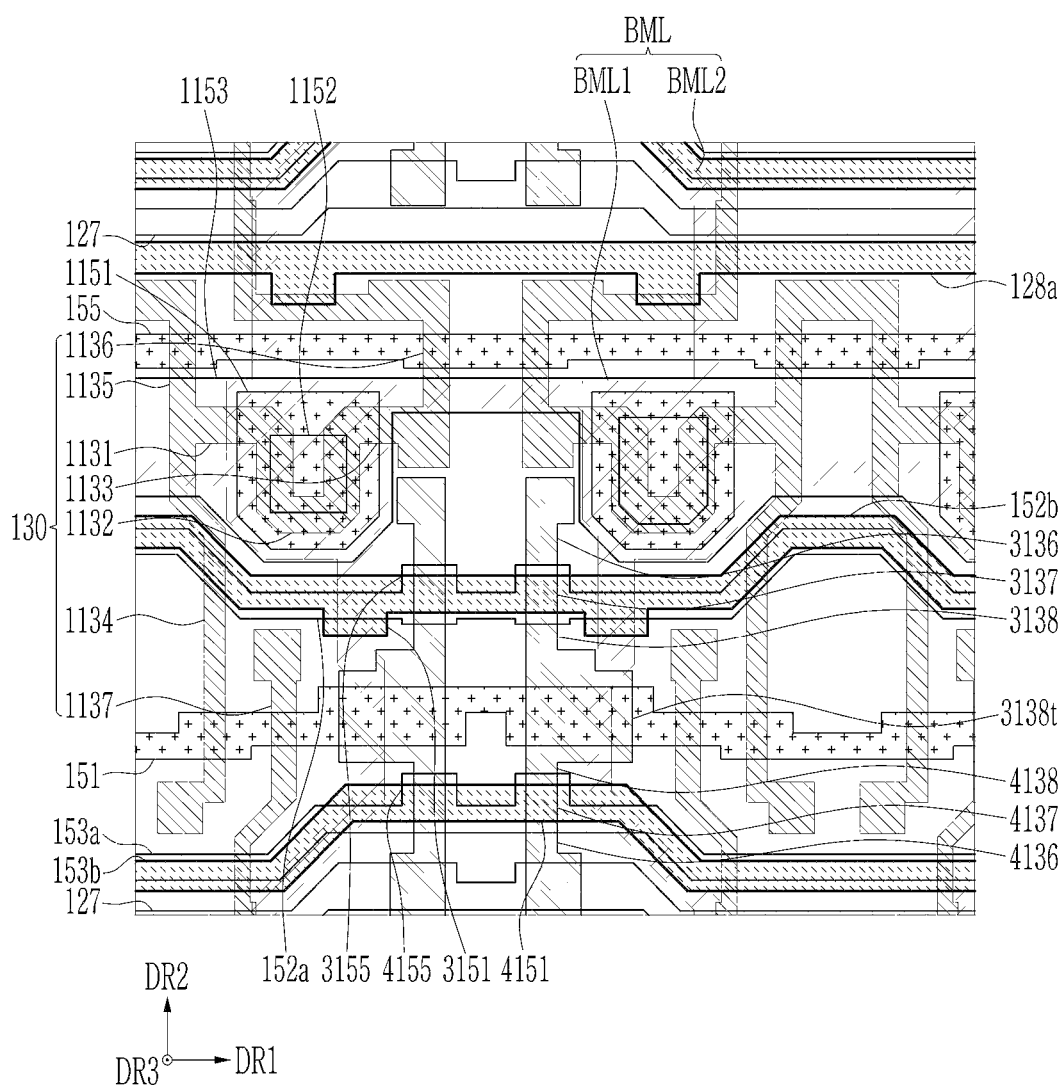

Referring to FIG. 16, a third gate conductive layer may be positioned on the third gate insulating layer 143 including the gate electrode 3151 of the third transistor T3 and the gate electrode 4151 of the fourth transistor T4.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may include an upper second scan line 152b and an upper initialization control line 153b.

The upper second scan line 152b and the upper initialization control line 153b may extend in the approximately horizontal direction (the first direction DR1). The upper second scan line 152b may form the second scan line 152 together with the lower second scan line 152a. The upper second scan line 152b may be electrically connected to the gate electrode 3151 of the third transistor T3. The upper second scan line 152*b* may be formed integrally with the gate electrode 3151 of the third transistor T3. The upper initialization control line 153*b* may form the initialization control line 153 together with the lower initialization control line 153*a*. The upper initialization control line 153*b* may be electrically connected to the gate electrode 4151 of the fourth transistor T4. The upper initialization control line 153*b* may be formed integrally with the gate electrode 4151 of the fourth transistor T4.

The third gate conductive layer may further include a lower second initialization voltage line 128*a*. The lower second initialization voltage line 128*a* may extend in approximately the horizontal direction (the first direction DR1), and the second initialization voltage AVinit may be applied.

The third gate conductive layer GAT3 may include a metal such as copper (Cu), molybdenum (Mo), aluminum (Al), or titanium (Ti), or a metal alloy thereof, and may be formed as a single layer or multiple layers.

After forming the third gate conductive layer including the gate electrode 3151 of the third transistor T3 and the gate electrode 4151 of the fourth transistor T4, a part of the oxide semiconductor layer covered by the third gate conductive layer is formed into a channel through a plasma treatment or doping process and a part of the oxide semiconductor layer not covered by the third gate conductive layer may become conductive. The channel 3137 of the third transistor T3 may be positioned under the gate electrode 3151 to overlap the gate electrode 3151. The first region 3136 and the second region 3138 of the third transistor T3 may not overlap the gate electrode 3151. The channel 4137 of the fourth transistor T4 may be positioned under the gate electrode 4151 to overlap the gate electrode 4151. The first region 4136 and the second region 4138 of the fourth transistor T4 may not overlap the gate electrode 4151. The upper boost electrode 3138*t* may not overlap the third gate conductive layer. A transistor including an oxide semiconductor layer may have characteristics of an N-type transistor.

Referring to FIG. 24, a second interlayer insulating layer 162 may be positioned on the third gate conductive layer including the gate electrode 3151 of the third transistor T3 and the gate electrode 4151 of the fourth transistor T4. The second interlayer insulating layer 162 may have a single-layer or multi-layer structure. The second interlayer insulating layer 162 may include an inorganic insulating material such as a silicon nitride (SiNx), a silicon oxide (SiOx), or a silicon oxynitride (SiOxNy), and may include an organic material depending on embodiments.

Figure 17:
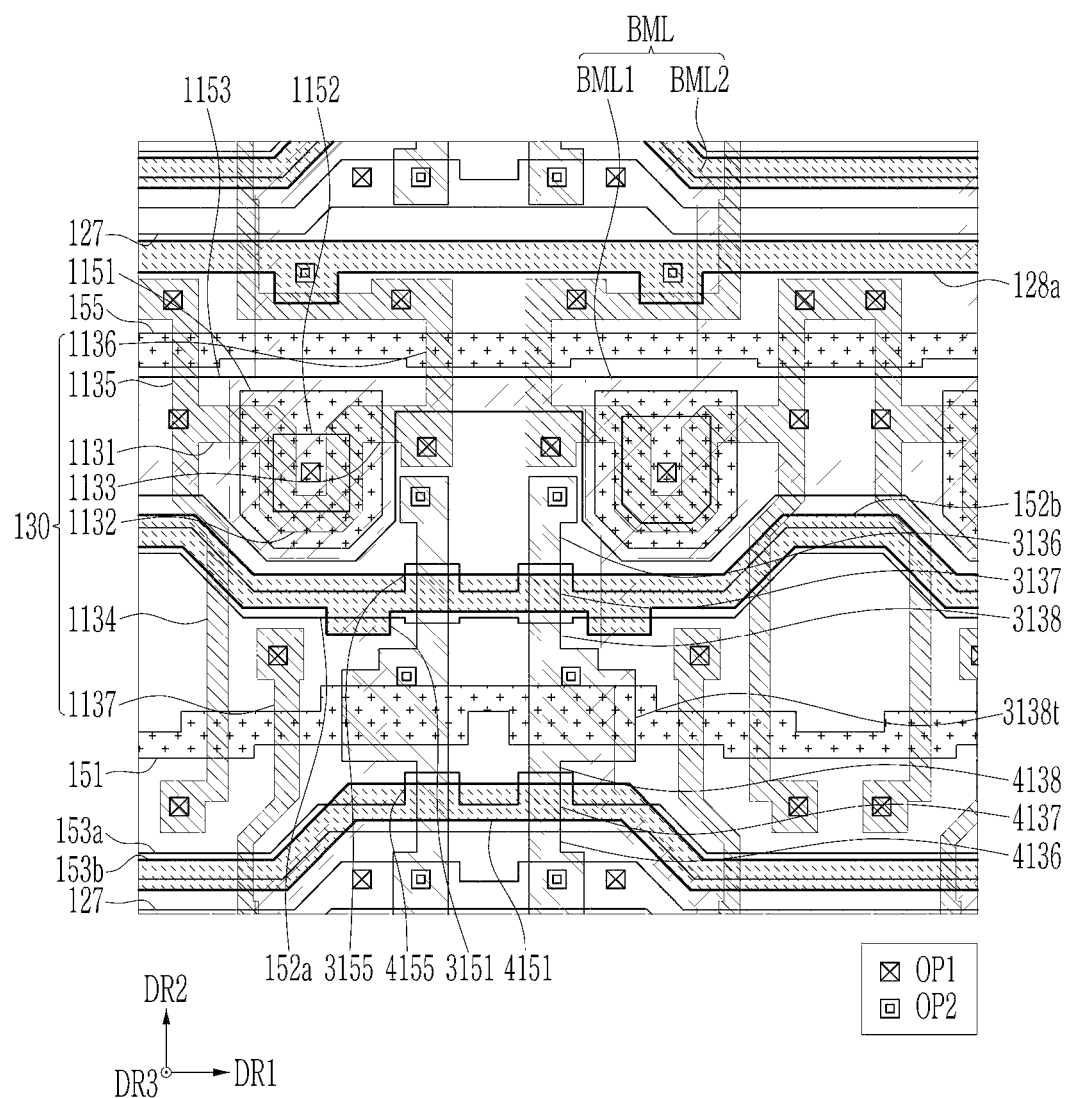

Referring to FIG. 17, two types of openings OP1 and OP2 may be formed in the second interlayer insulating layer 162. The two types of openings OP1 and OP2 may be formed using different masks.

The opening OP1 may form an opening in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The opening OP2 may form openings in the second interlayer insulating layer 162 and/or the third gate insulating layer 143, and may expose the oxide semiconductor layer or the third gate conductive layer.

One of the openings OP1 may overlap at least a part of the gate electrode 1151 of the driving transistor T1, and may also be formed in the third gate insulating layer 143, the first interlayer insulating layer 161, and the second gate insulating layer 142. One of the openings OP1 may overlap the opening 1152 of the first sustain electrode 1153, and may be positioned on the opening 1152 of the first sustain electrode 1153.

One of the OP2 may overlap at least a part of the boost capacitor $C_{boost}$, and may be formed on the third gate insulating layer 143.

Another one of the openings OP1 may overlap at least a part of the second region 1133 of the driving transistor T1, and a third opening 3165 may be formed on the third gate insulating layer 143, the first interlayer insulating layer 161, the second gate insulating layer 142, and the first gate insulating layer 141.

One of the openings OP2 may overlap at least a part of the third transistor T3, and may be formed on the third gate insulating layer 143.

Figure 18:
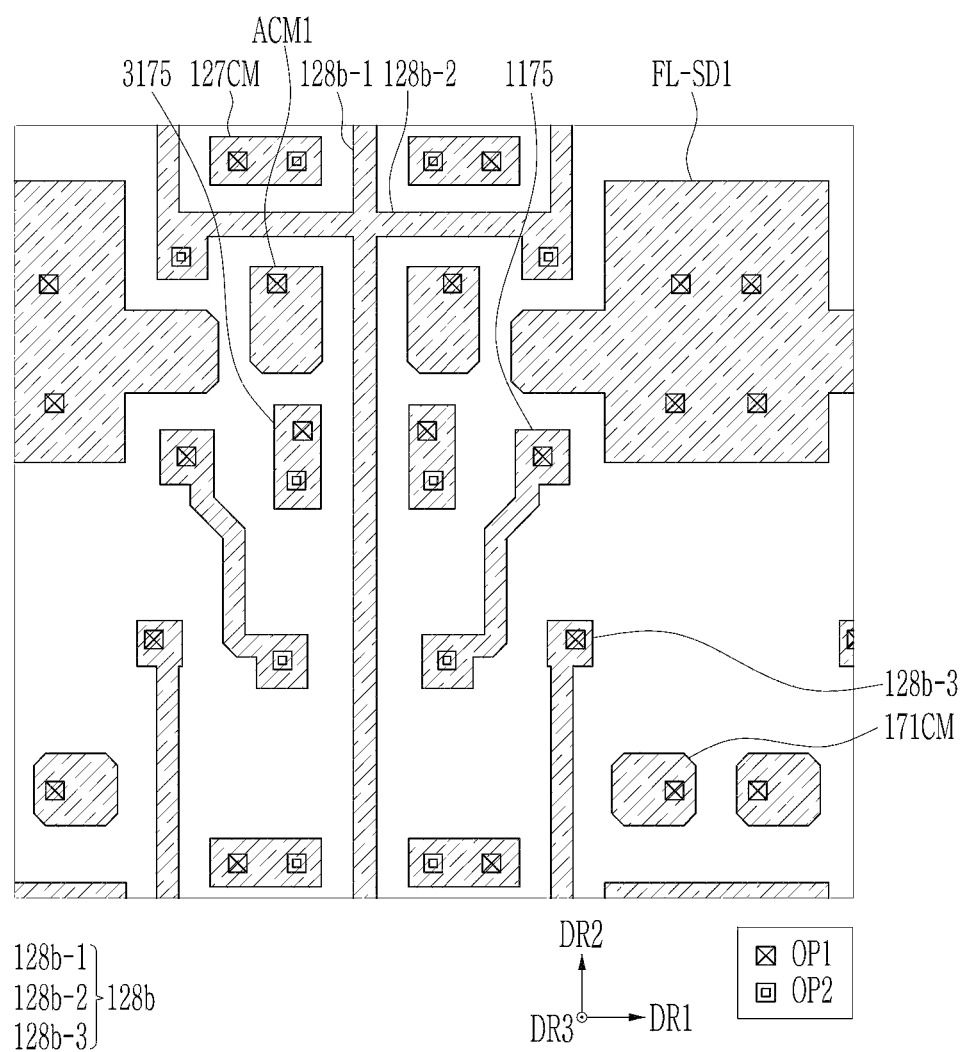
Figure 19:
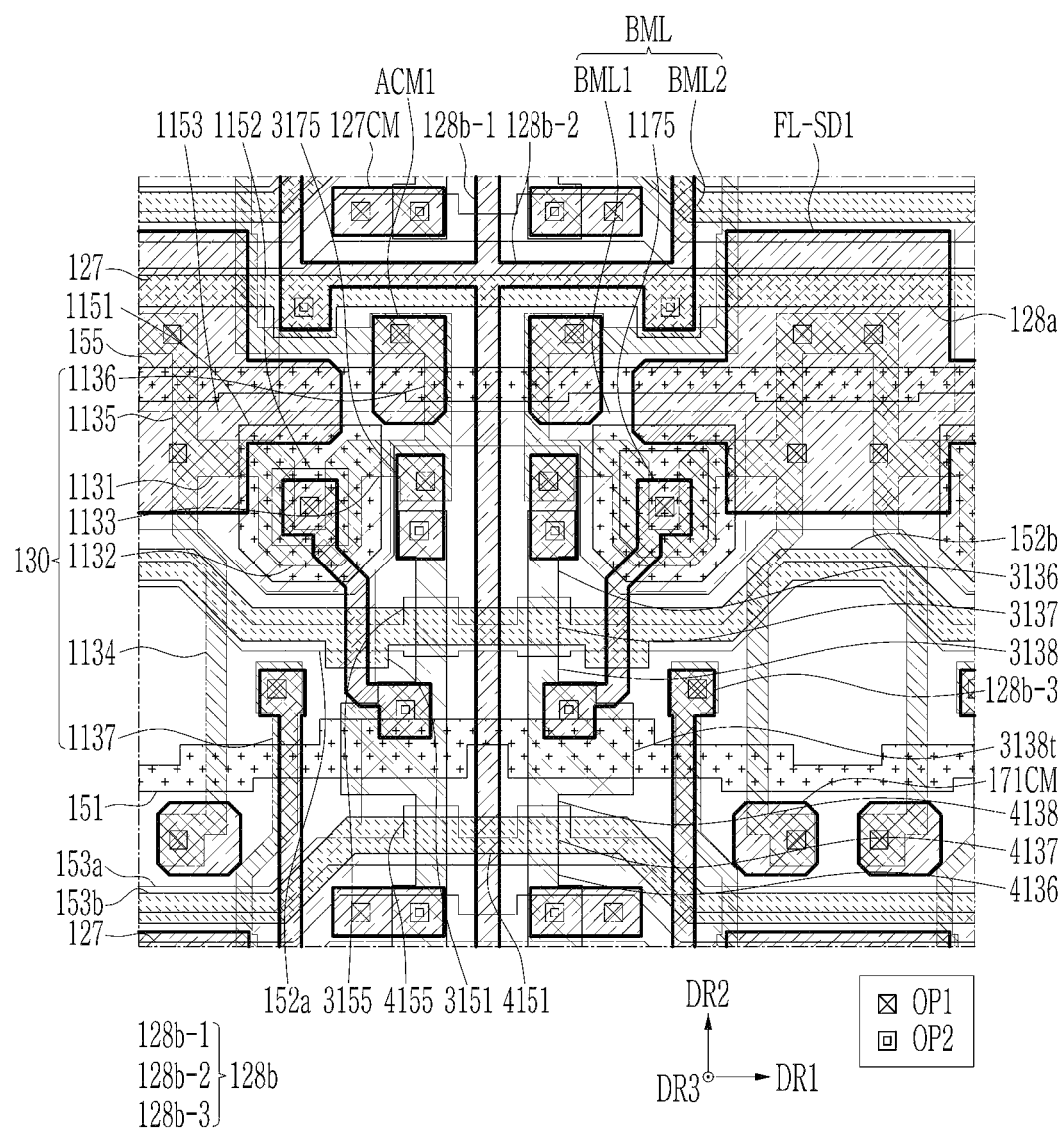

Referring to FIG. 18 and FIG. 19, a first data conductive layer including a first connection electrode 1175 and a second connection electrode 3175 may be positioned on the second interlayer insulating layer 162. Since the first data conductive layer may not be easily recognized in FIG. 19, FIG. 18 provides a top plan view of only the first data conductive layer and the openings OP1 and OP2 and FIG. 19 provides a top plan view illustrating all layers below the first data conductive layer.

The first connection electrode 1175 may overlap the gate electrode 1151 of the driving transistor T1. The first connection electrode 1175 may be electrically connected to the gate electrode 1151 of the driving transistor T1 through the opening OP1 and the opening 1152 of the first sustain electrode 1153. The first connection electrode 1175 may overlap the boost capacitor $C_{boost}$. The first connection electrode 1175 may be electrically connected to the upper boost electrode 3138*t* of the boost capacitor $C_{boost}$ through the opening OP2. Accordingly, the gate electrode 1151 of the driving transistor T1 and the upper boost electrode 3138*t* of the boost capacitor $C_{boost}$ may be electrically connected by the first connection electrode 1175. The gate electrode 1151 of the driving transistor T1 may also be electrically connected to the second region 3138 of the third transistor T3 and the second region 4138 of the fourth transistor T4 by the first connection electrode 1175.

The second connection electrode 3175 may overlap the second region 1133 of the driving transistor T1. The second connection electrode 3175 may be electrically connected to the second region 1133 of the driving transistor T1 through the opening OP1. The second connection electrode 3175 may overlap the first region 3136 of the third transistor T3. The second connection electrode 3175 may be electrically connected to the first region 3136 of the third transistor T3 through the opening OP2. Accordingly, the second region 1133 of the driving transistor T1 and the first region 3136 of the third transistor T3 may be electrically connected by the second connection electrode 3175.

The first data conductive layer may include a second initialization voltage line 128*b*. The second initialization voltage line 128*b* may include a wiring portion 128*b*-1 extended in a vertical direction (i.e., a second direction DR2), a first extending portion 128*b*-2 protruded to opposite sides of the wiring portion 128*b*-1 along the horizontal direction (the first direction DR1), and a second extending portion 128*b*-3 positioned while being bent again in the vertical direction (the second direction DR2) from the first extending portion 128*b*-2. At a portion where the first extending portion 128*b*-2 and the second extending portion 128*b*-3 meet, the second initialization voltage line 128 may be electrically connected to the second initialization voltage line 128a positioned on the third gate conductive layer through the opening OP2. Thus, the second initialization voltage AVinit may be transmitted in the horizontal direction (the first direction DR1) through the second initialization voltage line 128a positioned on the third gate conductive layer, and the second initialization voltage AVinit may also be transmitted in the vertical direction (second direction DR2) through the second initialization voltage line 128b positioned on the first data conductive layer.

An end of the second extending portion 128b-3 may be electrically connected to a portion 1137 of the first semiconductor layer 130 through the opening OP1.

The first data conductive layer may include connection portions 127CM and 171CM, an anode connection part ACM1, and an expansion portion FL-SD1 (hereinafter also referred to as a first expansion portion).

The connection portion 127CM may be electrically connected to the first initialization voltage line 127 of the second gate conductive layer through the opening OP1 and may be electrically connected to a portion 4136 of the second semiconductor layer (oxide semiconductor layer) through the opening OP2 such that the first initialization voltage Vinit flows through the first initialization voltage line 127 may be transmitted to the fourth transistor T4 of the oxide semiconductor layer.

The connection portion 171CM may be electrically connected to the portion 1137 of the first semiconductor layer 130, for example, the second transistor T2, through the opening OP1.

The anode connection part ACM1 may be electrically connected to a portion 1136 of the first semiconductor layer 130, for example, the sixth transistor T6, through the opening OP1.

The expansion portion FL-SD1 may be formed wide in order to planarize the anode positioned thereon. The expansion portion FL-SD1 may be electrically connected to a portion 1135 of the first semiconductor layer 130, for example, the fifth transistor T5, through the opening OP1, and may be also electrically connected to the first storage electrode 1153 through the opening OP1.

The first data conductive layer SD1 may include a metal such as aluminum (Al), copper (Cu), molybdenum (Mo), titanium (Ti), or a metal alloy thereof, and may be formed as a single layer or multiple layers.

Referring to FIG. 24, a first organic layer 181 may be positioned on the first data conductive layer including the first connection electrode 1175 and the second connection electrode 3175. The first organic layer 181 may be an organic insulator including an organic material, and the organic material may include at least one material selected from a group consisting of polyimide, polyamide, acryl resin, benzocyclobutene, and phenol resin.

Figure 20:
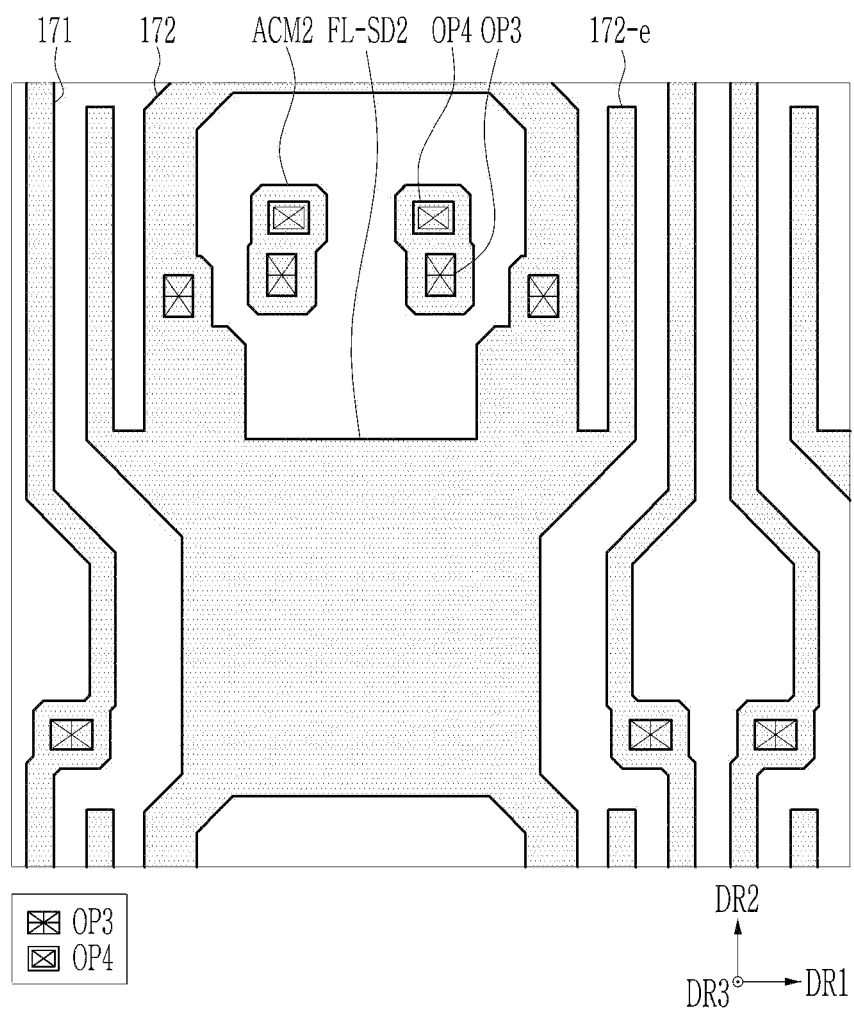
Figure 21:
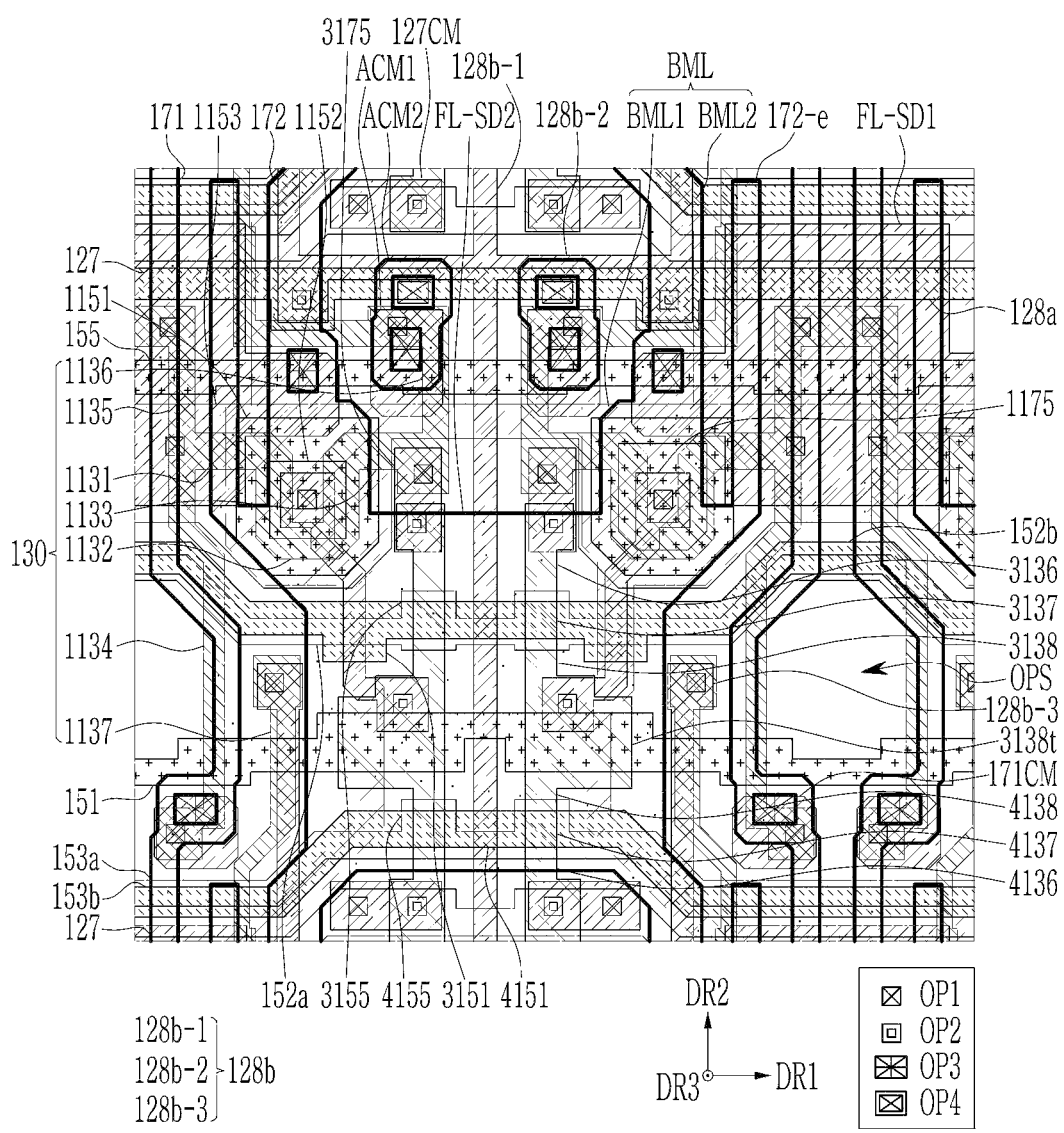
Figure 22:
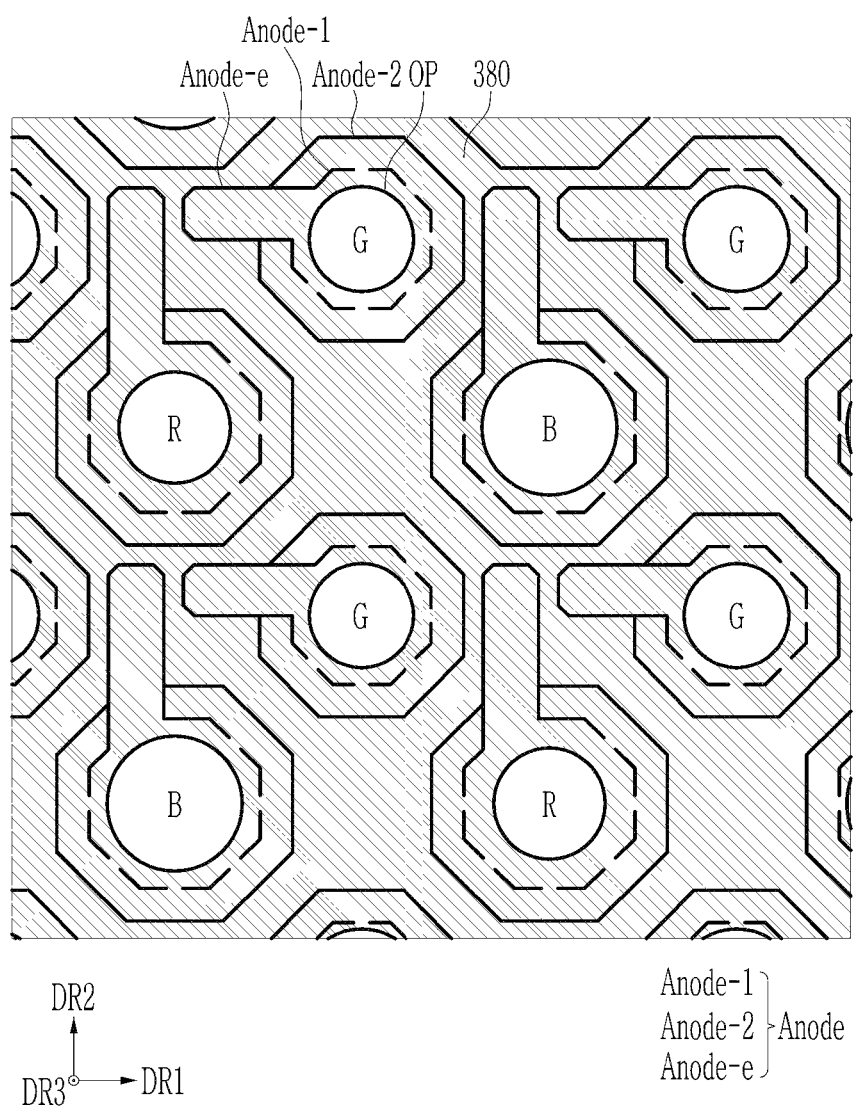

Referring to FIG. 20, FIG. 21, and FIG. 24, an opening OP3 may be disposed on the first organic layer 181. A second data conductive layer including the data line 171, the driving voltage line 172, and the anode connection part ACM2 may be positioned on the first organic layer 181. A second organic layer 182 (hereafter referred to as a lower organic layer) and a third organic layer 183 (hereafter also referred to as an upper organic layer) may be positioned on the second data conductive layer, and the second organic layer 182 and the third organic layer 183 may have openings OP4 (hereinafter referred to as "anode connection opening"). The anode connection part ACM2 may be electrically connected to the anode through the anode connection opening OP4. Since the second data conductive layer may not be easily recognized in FIG. 22, FIG. 21 shows only the second data conductive layer and the openings OP3 and OP4 through a top plan view, and FIG. 22 is a top plan view illustrating the second data conductive layer and all the peripheral layers.

Referring to FIG. 20 and FIG. 21, the opening OP3 may overlap the connection portion 171CM, the anode connection part ACM1, and the expansion portion FL-SD1 positioned on the first data conductive layer to expose them, respectively.

The second data conductive layer may include the data line 171, the driving voltage line 172, and the anode connection part ACM2.

The data line 171 and the driving voltage line 172 may extend in approximately a vertical direction (second direction DR2). The data line 171 may be electrically connected to the connection portion 171CM of the first data conductive layer through the opening OP3, and may be electrically connected to the second transistor T2 through the connection portion 171CM. The driving voltage line 172 may be electrically connected to the fifth transistor T5 and the first storage electrode 1153 through the expansion portion FL-SD1 of the first data conductive layer through the opening OP3. The anode connection part ACM2 may be electrically connected to the anode connection part ACM1 of the first data conductive layer through the opening OP3, and may be electrically connected to the sixth transistor T6.

Referring to FIG. 20, the driving voltage line 172 may include an expansion portion FL-SD2 and a protruded wiring portion 172-e, and may not be formed in a portion where the anode connection part ACM2 is formed.

The expansion portion FL-SD2 is formed wide in order to planarize the anode positioned thereon.

The protruded wiring portion 172-e of the driving voltage line 172 may be also formed as two on both sides of the two data line 171 in order to planarize an anode positioned thereon, and thus a total of four wire structures 171 and 172-e may be formed to be positioned below the anode.

Due to such a structure under the anode as described above (the expansion portion FL-SD1 and the wiring portion 128b-1 of the first data conductive layer, and the expansion portion FL-SD2, the data line 171, and the wiring portion 172-e of the second data conductive layer) and the organic layers 181, 182, and 183, the anode may have a flattening characteristic.

In the embodiment, the expansion portion FL-SD1 and the expansion portion FL-SD2 may be electrically connected with the driving voltage line 172 and thus the driving voltage ELVDD may be transmitted.

The second data conductive layer SD2 may include a metal such as aluminum (Al), copper (Cu), molybdenum (Mo), or titanium (Ti), or a metal alloy thereof, and may be formed as a single layer or multiple layers.

Referring to FIG. 24, the second organic layer 182 and the third organic layer 183 may be positioned on the second data conductive layer. The second organic layer 182 and the third organic layer 183 may be an organic insulator, and may include at least one material selected from a group consisting of polyimide, polyamide, acryl resin, benzocyclobutene, and phenol resin. Depending on embodiments, the third organic layer 183 may be omitted.

The anode connection openings OP4 may be formed on the second organic layer 182 and the third organic layer 183 such that the anode and the anode connection part ACM2 are electrically connected.

Referring to FIG. 22, the anode Anode may be formed on the third organic layer 183. As shown in FIG. 6, the anode Anode may include the anode center portion Anode-1, the anode peripheral portion Anode-2, and the extension portion Anode-e extended from the anode center portion Anode-1. Here, the anode center portion Anode-1 and the extension portion Anode-e may have a triple-layer structure An1, An2, and An3, and the anode peripheral portion Anode-2 may not include a metallic material capable of reflecting light, and may have a single-layer structure. Here, a lower layer An1 and an upper layer An3 may be formed of a transparent conductive material, a middle layer An2 may be formed of a metallic material that can reflect light, and in an embodiment, an indium tin oxide (ITO) may be used as the transparent conductive material, and silver (Ag) may be included as a metallic material included in the middle layer An2.

The anode peripheral portion Anode-2 may be formed wider than the anode center portion Anode-1 so as to cover the side surface of the anode center portion Anode-1 and may be formed to be wider.

Referring to FIG. 22 and FIG. 24, the black pixel defining layer 380 may be positioned on the anode Anode, and the anode exposing opening OP of the black pixel defining layer 380 may be formed to overlap the anode Anode.

A gap (refer to gop1 of FIG. 6; a gap between the anode exposing opening OP of the black pixel defining layer and an end of the anode center portion Anode-1) of a region where the black pixel defining layer 380 and the anode center portion Anode-1 overlap may be formed to be about 1 µm above or below from 2.5 µm, for example, about 1.5 µm or more and about 3.5 µm or less, to reduce a width where external light may be reflected in the black pixel defining layer 380, and an overlapping gap (refer to gop2 of FIG. 6; a gap between the opening of the black pixel defining layer and an end of the anode peripheral portion Anode-2) between the black pixel defining layer 380 and the anode peripheral portion Anode-2 may be formed to be about 2 µm above or below from 7.5 µm or 7.67 µm, for example, about 5.5 µm or more and about 9.5 µm or less to prevent the upper layer An3 of the anode Anode from being floated in the anode exposing opening OP of the black pixel defining layer 380. Here, the gap from one side of the anode center portion Anode-1 to one side of the anode peripheral portion Anode-2 may be about 2 µm or more and about 8 µm or less.

Due to the above structure of the anode Anode and the position relationship with the black pixel defining layer 380 or its opening OP, the reflectance of external light may be reduced and the floating problem between the black pixel defining layer 380 and the anode Anode may be removed, thereby improving display quality.

Figure 23:
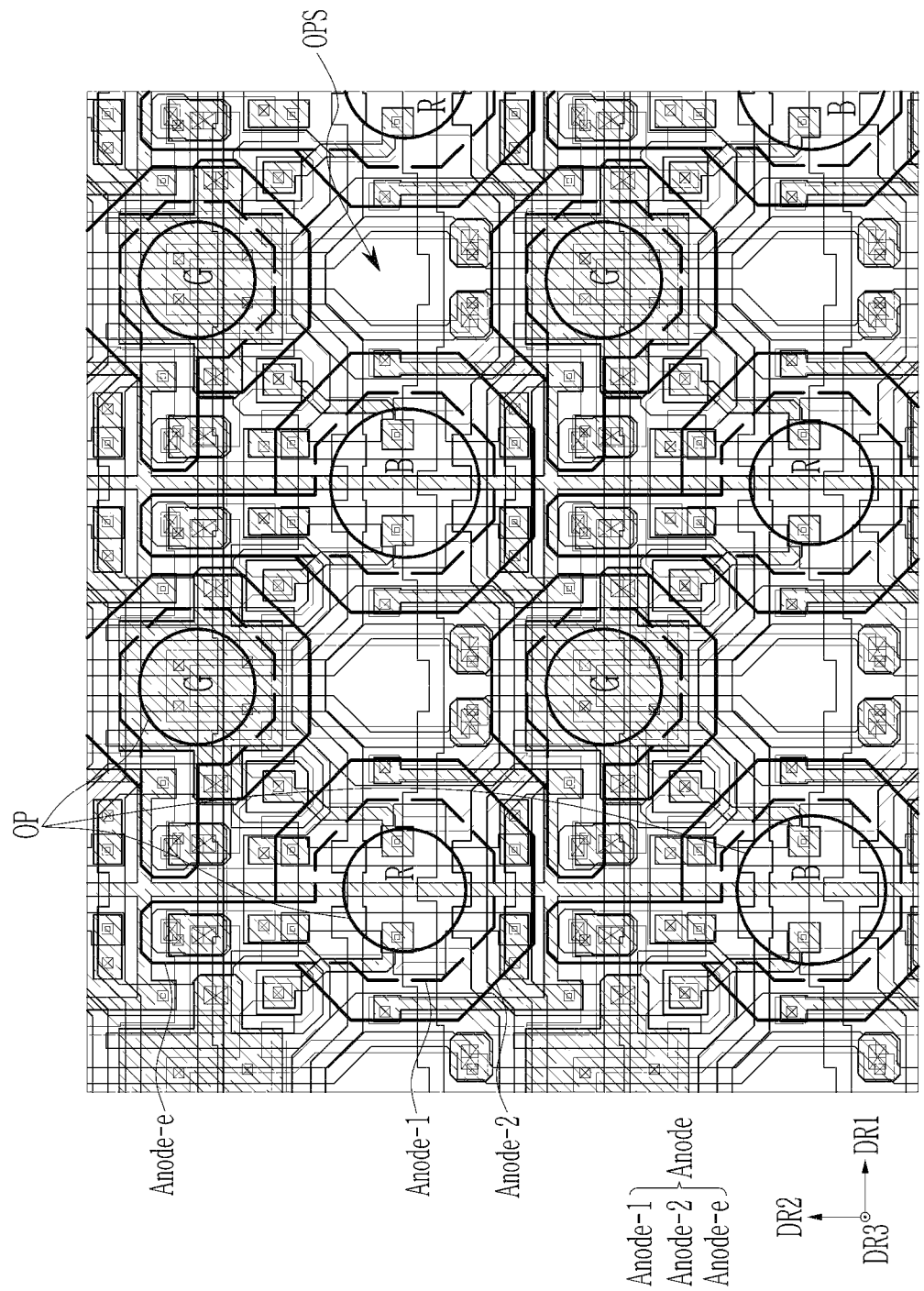

FIG. 23 shows a structure in which the structure as above is entirely stacked.

Referring to FIG. 21 and FIG. 23, in case that the light emitting display device DA includes the optical sensor region OPS as shown in FIG. 5, each conductive layer or semiconductor layer positioned on the lower panel layer may have a structure through which light may be transmitted because no pattern may be formed in the optical sensor region OPS. In the optical sensor region OPS, a conductive layer or a semiconductor layer may not be positioned, and all insulating layers such as inorganic and organic layers may be stacked each other. Depending on embodiments, a part of all the inorganic and organic layers of the lower panel layer may be omitted.

Depending on embodiments, in case that an additional opening is formed on a light blocking layer 220 or a red color filter 230R in a position corresponding to the optical sensor region OPS in the upper panel layer, an optical sensor on the back may sense the front of the light emitting display device.

In a normal pixel, as shown in FIG. 23, the optical sensor region OPS may be positioned in the lower panel layer, but the optical sensor region OPS may be prevented from being formed by preventing the light blocking layer 220 or the red color filter 230R from forming an additional opening in the upper panel layer.

Based on such a planar structure, an entire cross-sectional structure of the light emitting display device will be described with reference to FIG. 24.

FIG. 24 is a cross-sectional view of the light emitting display device according to the embodiment.

In FIG. 24, up to the upper panel layer is illustrated.

With reference to FIG. 24, a detailed stacked structure of a pixel of the display area DA will be described. Here, the display area DA may have a stacked structure of pixels positioned in a main display area D1 (also referred to as a first display area) and a second element area EA2 (also referred to as a component region). In the embodiment of FIG. 24, the pixel circuit portion may imply a configuration positioned below the second organic layer 182 and the third organic layer 183, and a light emitting diode may imply an upper part of the third organic layer 183, while being a part of the configuration positioned below the encapsulation layer 400. Up to the encapsulation layer 400 is called the lower panel layer, and the layer formed on the encapsulation layer 400 is called the upper panel layer.

A brief look at the stacked structure of the display area DA of FIG. 24 is as follows.

The metal layer BML may be positioned on the substrate 110, and the metal layer BML may be disposed in a region overlapping a channel of the first semiconductor layer ACT1. The buffer layer 111 may be positioned on the metal layer BML to cover the same, and the first semiconductor layer ACT1 may be positioned on the buffer layer 111. The first semiconductor layer ACT1 may include a channel region, and a first area and a second area respectively positioned at opposite sides of the channel region.

The first gate insulating layer 141 may cover the first semiconductor layer ACT1 or may be positioned to overlap only the channel region of the first semiconductor layer ACT1. A first gate conductive layer GAT1 may be positioned on the first gate insulating layer 141, and the first gate conductive layer GAT1 may include a gate electrode of a transistor LTPS TFT including a silicon semiconductor. A region overlapping the gate electrode in a plan view among the first semiconductor layer ACT1 may be a channel region. The gate electrode may serve as one electrode of the storage capacitor. The transistor LTPS TFT including a silicon semiconductor may include a gate electrode of the first semiconductor layer ACT1 and a gate electrode of the first gate conductive layer GAT1 overlapping the semiconductor layer ACT1 in a plan view.

The first gate conductive layer GAT1 may be covered with the second gate insulating layer 142, and the second gate conductive layer GAT2 is positioned on the second gate insulating layer 142. The second gate conductive layer GAT2 may include a first storage electrode that forms a storage capacitor by overlapping the gate electrode, and a lower shielding layer for an oxide semiconductor transistor, disposed below the oxide semiconductor layer ACT2.

The second gate conductive layer GAT2 may be covered by the first interlayer insulating layer 161, the oxide semiconductor layer ACT2 may be positioned on the first interlayer insulating layer 161, and the oxide semiconductor layer ACT2 may include a channel region, and a first region and a second region disposed at opposite sides of the channel region.

The oxide semiconductor layer ACT2 may be covered by the third gate insulating layer 143, and the third gate conductive layer GAT3 may be positioned on the third gate insulating layer 143. The third gate conductive layer GAT3 may include a gate electrode of an oxide semiconductor transistor Oxide TFT and a connection part electrically connected to the lower shielding layer for the oxide semiconductor transistor. The oxide semiconductor transistor Oxide TFT may include a gate electrode of the oxide semiconductor layer ACT2 and a third gate conductive layer GAT3 overlapping it in a plan view.

The third gate conductive layer GAT3 may be covered by the second interlayer insulating layer 162, and the first data conductive layer SD1 may be positioned on the second interlayer insulating layer 162. The first data conductive layer SD1 may serve to provide a voltage or a current to the first semiconductor layer ACT1 and the oxide semiconductor layer ACT2, including a connection part, or to transmit a voltage or a current to another device.

The first data conductive layer SD1 may be covered by the first organic layer 181, and the second data conductive layer SD2 may be positioned on the first organic layer 181. The second data conductive layer SD2 may be electrically connected to the first data conductive layer SD1 through the opening. The second data conductive layer SD2 may be covered by the second organic layer 182 and the third organic layer 183.

The anode Anode may be positioned on the third organic layer 183, and as shown in FIG. 6, the anode Anode may include the anode center portion Anode-1, the anode peripheral portion Anode-2, and the extension portion Anode-e extended from the anode center portion Anode-1. The extension portion Anode-e of the anode Anode may have a structure electrically connected to the second data conductive layer SD2 through the opening anode connection OP4 positioned on the second organic layer 182 and the third organic layer 183. Referring to FIG. 24, a gap gop4 between the anode center portion Anode-1 and the anode connection opening OP4 positioned in the second organic layer 182 and the third organic layer 183 may have a value of about 12 μm or less or about 10 μm or more, which is a value that may be changed according to the position of the anode Anode.

The anode center portion Anode-1 and the extension portion Anode-e may have a triple-layered structure An1, An2, and An3, and referring to the enlarged portion of FIG. 24, the anode peripheral portion Anode-2 may not include a metallic material capable of reflecting light, and may have a structure that is extended in a single layer structure. Here, the lower layer An1 and the upper layer An3 may be formed of a transparent conductive material, the middle layer An2 may be formed of a metallic material that may reflect light, and in an embodiment, an indium tin oxide (ITO) may be used as the transparent conductive material, and silver (Ag) may be included as a metallic material included in the middle layer An2.

The anode peripheral portion Anode-2 may be formed wider than the anode center portion Anode-1 so as to cover the side surface of the anode center portion Anode-1 and may be formed to be wider.

On top of the anode, a black pixel defining layer 380 that includes an anode exposing opening OP (hereinafter, referred to as an opening for exposing the anode) overlapping at least a part of the anode Anode, while overlapping the other part of the anode Anode may be positioned on the anode Anode. The black pixel defining layer 380 may further include a light blocking material in addition to the organic insulating material.

A gap gop1 (a gap between the anode exposing opening OP of the black pixel defining layer and an end of the anode center portion Anode-1) of a region where the black pixel defining layer 380 and the anode center portion Anode-1 overlap may be formed to be about 1 μm above or below from 2.5 μm, for example, about 1.5 μm or more and about 3.5 μm or less, to reduce a width where external light can be reflected in the black pixel defining layer 380, and an overlapping gap gop2 (a gap between the anode exposing opening OP of the black pixel defining layer and an end of the anode peripheral portion Anode-2) between the black pixel defining layer 380 and the anode peripheral portion Anode-2 may be formed to be about 2 μm above or below from 7.5 μm or 7.67 μm, for example, about 5.5 μm or more and about 9.5 μm or less to prevent the upper layer An3 of the anode Anode from being floated in the anode exposing opening OP of the black pixel defining layer 380. Here, a gap from one side of the anode center portion Anode-1 to one side of the anode peripheral portion Anode-2 may be about 2 μm or more and about 8 μm or less.

Due to the above structure of the anode Anode and the position relationship with the black pixel defining layer 380 or its opening OP, the reflectance of external light may be reduced and the floating problem between the black pixel defining layer 380 and the anode Anode may be eliminated, thereby improving display quality.

A spacer 385 may be formed on the black pixel defining layer 380. The spacer 385 may be formed in a structure having a step, and the spacer 385 may include a first portion 385-1 positioned in a high and narrow region and a second portion 385-2 positioned in a low and wide region. For example, the spacer 385 may include the first portion 385-1 and the second portion 385-2 that has a lower height than the first portion 385-1 and integrally formed with the first portion 385-1.

A light emitting layer EML may be positioned on the anode Anode, while being inside the anode exposing opening OP of the pixel defining layer 380. A function layer FL may be positioned on the spacer 385 and the exposed black pixel defining layer 380, and the function layer FL may be formed on the entire light emitting display panel DP. The function layer FL may include an electron injection layer, an electron transport layer, a hole transport layer, and a hole injection layer, and the function layer FL may be positioned above and below the light emitting layer EML. For example, the hole injection layer, the hole transport layer, the light emitting layer EML, the electron transport layer, the electron injection layer, and the cathode Cathode may be sequentially positioned on the anode Anode, and thus the hole injection layer and the hole transport layer may be positioned below the light emitting layer EML, and the electron transport layer and the electron injection layer may be positioned on the light emitting layer EML.

The cathode Cathode may be formed of a light-transmitting electrode or a reflecting electrode. The cathode may be integrally formed over the entire surface of the light emitting display panel DP except for the light transmitting region.

An encapsulation layer 400 may be positioned on the cathode Cathode. The encapsulation layer 400 may include at least one inorganic layer and at least one organic layer, and may have a triple layer structure including a first inorganic encapsulation layer, an organic encapsulation layer, and a second inorganic encapsulation layer. The encapsulation layer 400 may be provided for protecting the light emitting layer EML formed of the organic material from moisture or oxygen that may be inflowed from the outside. Depending on embodiments, the encapsulation layer 400 may include a structure in which an inorganic layer and an organic layer are sequentially further stacked.

Sensing insulation layers 501, 510, and 511 and two sensing electrodes 540 and 541 may be positioned on the encapsulation layer 400 for touch sensing. A lower sensing insulation layer 501 may be positioned on the encapsulation layer 400, a lower sensing electrode 541 may be positioned on the lower sensing insulation layer 501, an intermediate sensing insulation layer 510 may be positioned on the lower sensing electrode 541, an upper sensing electrode 540 may be positioned on the intermediate sensing insulation layer 540, and an upper sensing insulation layer 511 may be positioned on the upper sensing electrode 540.

A light blocking layer 220 and a color filter 230 are positioned on the upper sensing insulation layer 511.

The light blocking layer 220 may be positioned so as to overlap the sensing electrodes 540 and 541 in a plan view, and may be positioned so as to not overlap the anode Anode in a plan view. This is to prevent the anode Anode and light emitting layer EML capable of displaying an image from being covered by the light blocking layer 220 and the sensing electrodes 540 and 541.

The anode connection opening OP4 for anode connection formed in the second organic layer 182 and the third organic layer 183 may overlap the black pixel defining layer 380 and the light blocking layer 220 in a plan view, and the anode connection opening OP4 for the anode connection may overlap at least a part of the sensing electrodes 540 and 541 in a plan view.

The light blocking layer opening OPBM may overlap the anode exposing opening OP of the black pixel defining layer 380 in a plan view and may be formed wider than the anode exposing opening OP of the black pixel defining layer 380, and a gap gops between the light blocking layer opening OPBM and the anode exposing opening OP of the black pixel defining layer 380 may be formed at about 1.5 μm above or below from 5.72 μm or 6.02 μm, for example, about 4.5 μm or more and about 7.5 μm or less. As such, the light blocking layer opening OPBM may be formed larger than the anode exposing opening OP of the black pixel defining layer 380, and a part of the black pixel defining layer 380 may be exposed by the light blocking layer opening OPBM.

An overlapping gap gopbm1 (a gap between the light blocking layer opening OPBM and an end of the anode center portion Anode-1) of the opening OPBM of the light blocking layer 220 and the anode center portion Anode-1 may be formed to be about 3.5 μm or more and about 8.5 μm or less, and an overlapping gap gopbm2 (a gap between the light blocking layer opening OPBM and an end of the anode peripheral portion Anode-2) between the light blocking layer 220 and the anode peripheral portion Anode-2 may be smaller than gopbm1, and may be formed at about 0.5 μm above or below from 1.65 μm, for example, about 1.0 μm or more and about 2.0 μm or less.

The color filter 230 may be positioned on the sensing insulation layers 501, 510, and 511 and the light blocking layer 220. The color filter 230 may include a red color filter that transmits red light, a green color filter that transmits green light, and a blue color filter that transmits blue light. Each color filter 230 may be positioned so as to overlap the anode Anode of the light emitting diode in a plan view. Since light emitted from the light emitting layer EML may be emitted while being changed to a corresponding color while passing through a color filter, all of the light emitted from the light emitting layer EML may have the same color. However, in the light emitting layer EML, different colors of light may be displayed, and the displayed color may be enhanced by passing through a color filter of the same color.

The light blocking layer 220 may be positioned between each color filter 230. Depending on embodiments, the color filter 230 may be replaced with a color conversion layer or may further include a color conversion layer. The color conversion layer may include quantum dots.

A planarization layer 550 covering the color filter 230 may be positioned on the color filter 230. The planarization layer 550 may be a transparent organic insulator. Depending on embodiment, a low refractive layer and an additional planarization layer may be positioned on the planarization layer 550 to improve front visibility and light output efficiency of the display panel. Light may be emitted while being refracted to the front by the low refractive layer and the additional planarization layer having high refractive properties. The low refractive layer and the additional planarization layer may be positioned on (e.g., positioned directly on) the color filter 230 while the planarization layer 550 may be omitted depending on embodiments.

In the embodiment, the polarizer on the planarization layer 550 may not be included. For example, the polarizer may serve to prevent display deterioration which the user recognizes as external light that is incident and reflected from the anode Anode. However, in the embodiment, a structure in which the black pixel defining layer 380 covers the side of the anode Anode to reduce the degree of reflection from the anode Anode, and the light blocking layer 220 is formed to reduce the incidence of light to prevent deterioration of display quality due to reflection has already been included. Therefore, it may not be necessary to separately form the polarizer on the front of the light emitting display panel DP.

A reflection adjusting layer may be disposed on the light blocking layer 220. The reflection adjusting layer may selectively absorb light of a wavelength of a partial band among light reflected inside the display device or light incident outside the display device. The reflection adjusting layer may fill the opening OP.

For example, the reflection adjusting layer may absorb a first wavelength region of about 490 nm to about 505 nm and a second wavelength region of 585 nm to 600 nm, and thus light transmittance in the first wavelength region and second wavelength region may be about 40% or less. The reflection adjusting layer may absorb light of a wavelength outside the emission wavelength range of red, green, or blue emitted from the light emitting diode ED. As described, the reflection adjusting layer may absorb light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In an embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammoniumbased compound, a dipyrromethene-based compound, a cyanine-based compound, and a combination thereof.

In an embodiment, the reflection adjusting layer may have transmittance of about 64% to about 72%. The transmittance of the reflection adjusting layer may be adjusted according to the content of the pigment and/or dye included in the reflection adjusting layer.

According to embodiments, the reflection adjusting layer may not be disposed in the first element area EA1. An embodiment including the reflection adjusting layer may include a capping layer and a low reflection layer disposed between the cathode Cathode and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate 110.

The low reflective layer may include an inorganic material having low reflectance, and in an embodiment, it may include a metal or metal oxide. In case that the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In case that the low reflective layer contains a metal oxide, it may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination thereof.

In an embodiment, an absorption coefficient (k) of the inorganic material included in the low reflective layer may be about 4.0 or less and about 0.5 or more ($0.5 \leq k \leq 4.0$). The inorganic material included in the low reflective layer may have a refractive index (n) of about 1 or more ($n \geq 1.0$).

The low reflective layer may include destructive interference between the light incident into the display device and the light reflected from the metal disposed under the low reflective layer, thereby reducing reflection of external light. Accordingly, the display quality and visibility of the display device may be improved by reducing the reflection of the external light of the display device through the low reflective layer.

According to embodiments, the capping layer may not be formed, and then the low reflective layer may contact the cathode Cathode (e.g., direct contact).

The encapsulation layer may be disposed on the low reflective layer, and other structures may be the same as FIG. 24.

Hereinafter, a planar structure including the upper panel layer according to an embodiment will be described with reference to FIG. 25.

Figure 25:
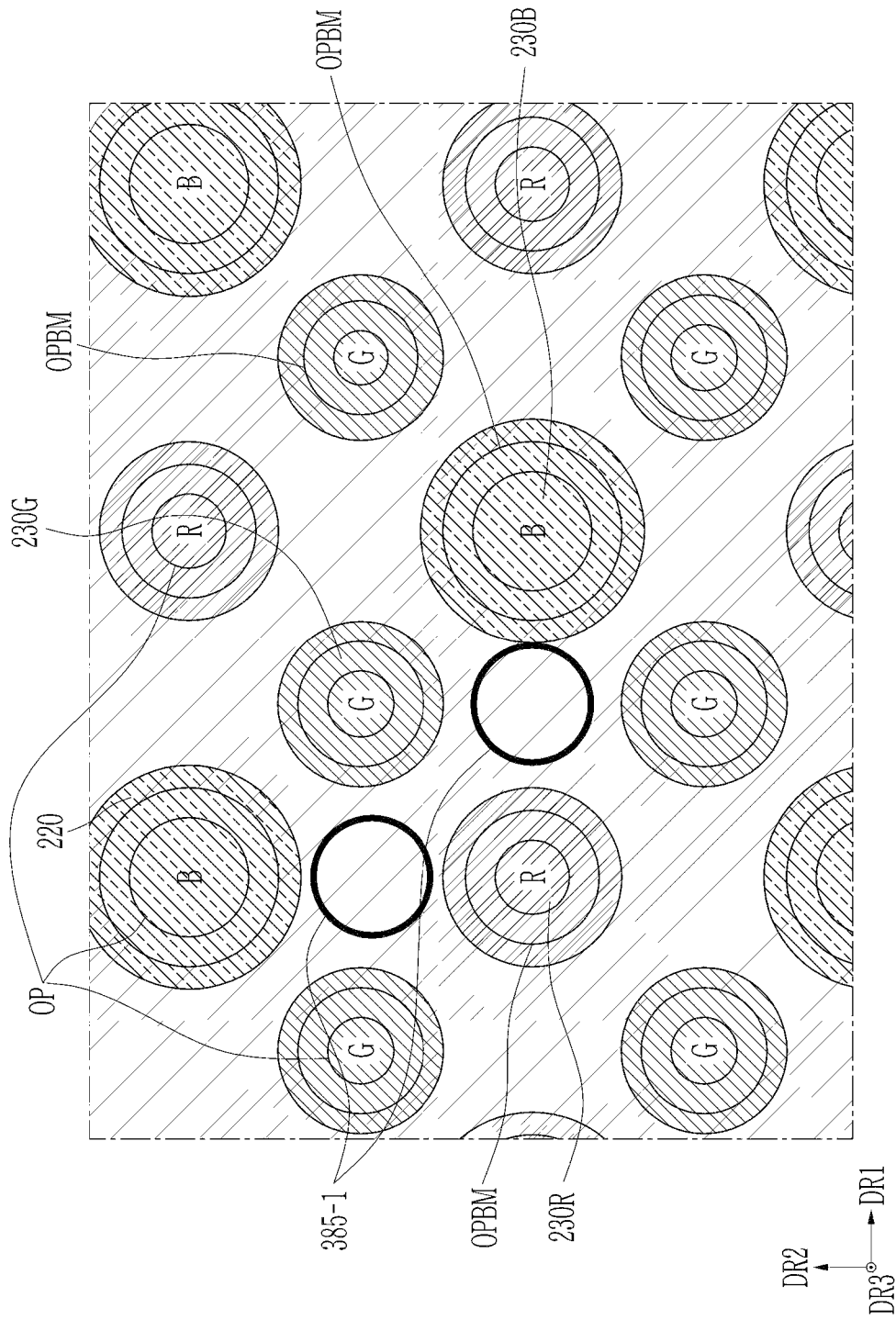
FIG. 25 is a top plan view of a part of the upper panel layer of the light emitting display device according to an embodiment.

FIG. 25 is a top plan view of a part of the upper panel layer of the light emitting display device according to an embodiment.

In FIG. 25, in order to clearly illustrates a relationship between the upper panel layer and the lower panel layer, the anode exposing opening OP of the black pixel defining layer 380 and the first portion 385-1 of the spacer 385 are additionally illustrated.

The light blocking layer 220 may include an opening OPBM, and may be formed wider while overlapping the anode exposing opening OP of the black pixel defining layer 380 in a plan view.

The color filters 230R, 230G, and 230B may be positioned at positions corresponding to the opening OPBM of the light blocking layer 220. The color filters 230R, 230G, and 230B may also be positioned on a portion of the upper surface of the light blocking layer 220 while filling the opening OPBM of the light blocking layer 220. The remaining part of the upper surface of the light blocking layer 220 may not be covered by the color filters 230R, 230G, and 230B. In FIG. 25, it is illustrated that the color filters 230R, 230G, and 230B and the light blocking layer 220 of each color are shown with different hatching to be easily distinguished. Depending on embodiments, one color of the color filters 230R, 230G, and 230B may have an opening and may be disposed as a whole, and the other two colors may have a structure that fills the opening.

Referring to FIG. 25, the position of the first portion 385-1 of the spacer 385 is also shown, and it may be formed in a position overlapping the light blocking layer 220 in a plan view. However, in the first portion 385-1 of the spacer 385, the black pixel defining layer 380 may be formed above with reference to the third direction DR3, but it may be positioned below the light blocking layer 220 with reference to the third direction DR3.

Hereinafter, a variation of FIG. 7 will be described with reference to FIG. 26.

Figure 26:
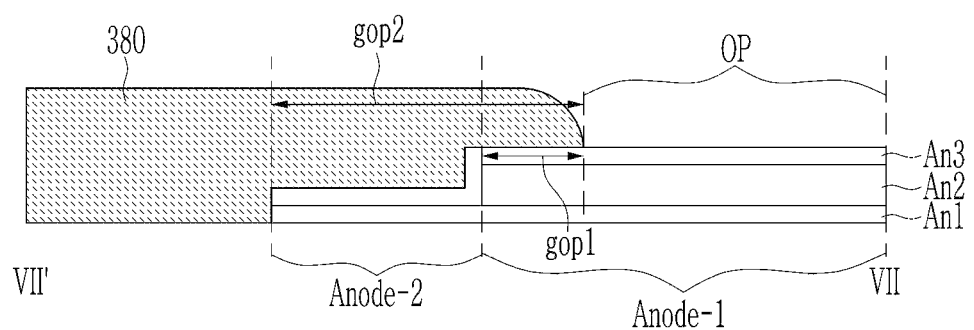
FIG. 26 is a schematic cross-sectional view of a structure of an anode of a display device according to an embodiment.

FIG. 26 is a schematic cross-sectional view of a structure of an anode of a display device according to an embodiment.

Unlike the anode Anode of FIG. 7, an anode Anode according to an embodiment of FIG. 26 may include a double-layered anode peripheral portion Anode-2. For example, the anode peripheral portion Anode-2 according to the embodiment of FIG. 26 may not contain metallic materials that can reflect light and may include a double layer structure, for example, a structure including a lower layer An1 and an upper layer An3 formed of a transparent conductive material, and a middle layer An2 formed of a metallic material that can reflect light may not be included. In the embodiment, an indium tin oxide (ITO) may be used as a transparent conductive material, and silver (Ag) may be included as a metallic material included in the middle layer An2.

The anode Anode FIG. 6 and the anode Anode FIG. 26 may have the same characteristic except that the anode peripheral portion Anode-2 may have a double-layer structure.

For example, the anode peripheral portion Anode-2 may be formed wider than the anode center portion Anode-1, and the upper layer An3 of the anode peripheral portion Anode-2 may cover the side surface of the anode center portion Anode-1 and may be formed wider.

A gap gop1 (a gap between the anode exposing opening OP of the black pixel defining layer and an end of the anode center portion Anode-1) of a region where the black pixel defining layer 380 and the anode center portion Anode-1 overlap may be formed to be about 1 μm above or below from 2.5 μm, for example, about 1.5 μm or more and about 3.5 μm or less as shown in the embodiment of FIG. 6, to reduce a width where external light may be reflected in the black pixel defining layer 380, and an overlapping gap gop2 (a gap between the opening of the black pixel defining layer and an end of the anode peripheral portion Anode-2) between the black pixel defining layer 380 and the anode peripheral portion Anode-2 may be formed to be about 2 μm above or below from 7.5 μm or 7.67 μm, for example, about 5.5 μm or more and about 9.5 μm or less as shown in the embodiment of FIG. 6 to prevent the upper layer An3 of the anode Anode from being floated in the anode exposing opening OP of the black pixel defining layer 380. Due to the above structure of the anode Anode and the position relationship with the black pixel defining layer 380 or its opening OP, the reflectance of external light may be reduced and the floating problem between the black pixel defining layer 380 and the anode Anode may be removed, thereby improving display quality.

Here, a gap from one side of the anode center portion Anode-1 to one side of the anode peripheral portion Anode-2 may be about 2 μm or more and about 8 μm or less.

Although it is not illustrated in FIG. 26, the relationship between the opening OPBM of the light blocking layer 220 and the anode Anode as shown in FIG. 9 may be the same as the anode Anode of FIG. 6.

For example, the light blocking layer opening OPBM may overlap the anode exposing opening OP of the black pixel defining layer 380 in a plan view and may be formed wider than the anode exposing opening OP of the black pixel defining layer 380, and a gap gops between the light blocking layer opening OPBM and the anode exposing opening OP of the black pixel defining layer 380 may be about 1.5 μm above or below from 5.72 μm or 6.02 μm, for example, it may be formed between about 4.5 μm and about 7.5 μm. As such, the light blocking layer opening OPBM may be formed larger than the anode exposing opening OP of the black pixel defining layer 380, and a part of the black pixel defining layer 380 may be exposed by the light blocking layer opening OPBM.

On the other hand, an overlapping gap gopbm1 (a distance between the light blocking layer opening OPBM and an end of the anode center portion Anode-1) between the opening OPBM of the light blocking layer 220 and the anode center portion Anode-1 may be about 3.5 μm or more and about 8.5 μm or less, and an overlapping gap gopbm2 (a distance between the light blocking layer opening OPBM and an end of the anode peripheral portion Anode-2) between the light blocking layer 220 and the anode peripheral portion Anode-2 may be smaller than the overlapping gap gopbm1, and it may be formed about 0.5 μm above or below from 1.65 μm, for example, about 1.0 μm or more and about 2.0 μm or less.

Hereinafter, with reference to FIG. 27 and FIG. 28, in case of using the black pixel defining layer 380, the floating problem of the anode that occurs in the opening portion of the black pixel defining layer 380 will be described in detail.

FIG. 27 and FIG. 28 show floating problems that may occur between the anode and the black pixel defining layer.

In case using the black pixel defining layer 380 in the embodiment, the black pixel defining layer 380 may have a black color, which has a merit to reduce the reflection of external light.

However, the black pixel defining layer 380 may contain a black color pigment as an organic material having a black color, but there is a drawback in that the contact characteristic is not good with the transparent conductive material included in the anode Anode due to the physical properties of the material. For example, in case that etching is carried out to form an opening in the black pixel defining layer 380, the upper layer An3 formed of the transparent conductive material of the anode Anode may have a floating problem as shown in FIG. 27. In the opening of the black pixel defining layer 380, a light emitting layer EML (refer to FIG. 24) may be positioned, and in case that the upper layer An3 of the anode Anode floats, the contact between the anode Anode and the light emitting layer EML may become poor such that there may be a problem of emitting low luminance compared to the case a current is applied to a light emitting element.

As one of methods for eliminating such a problem, as shown in FIG. 28, the upper layer An3 may not float in the opening of the black pixel defining layer 380 in case that a region where the black pixel defining layer 380 and the anode Anode overlap may be formed above a certain level. For example, it may be observed that, in FIG. 27, a width gap-o1 of the region where the black pixel defining layer 380 and the anode Anode overlap may be below a certain level and thus the problem that the upper layer An3 is lifted (An3') occurs, but in the case that a width gap-o2 of the region where the black pixel defining layer 380 and the anode Anode shown in FIG. 28 is above a certain level, the upper layer An3 may not be lifted.

Here, the width above a certain level where the black pixel defining layer 380 and the anode Anode should overlap may be about 5.5 μm or more, and considering the deviation that may occur during the process, the problem of floating does not occur when the black pixel defining layer 380 may be formed at the level of about 7.5 μm.

In the embodiment, not as in FIG. 28, a certain width or more for overlapping between the black pixel defining layer 380 and the anode Anode may be secured by extending only the upper layer An3 of the anode Anode, thereby eliminating the problem of floating, and simultaneously, the middle layer An2 may be formed with a minimum width to reduce the width of the portion where the tip of the black pixel defining layer 380 is thinly formed, and to reduce reflected light.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A light emitting display device comprising:
    an organic layer that is positioned on a substrate, and includes an anode connection opening;
    an anode that is positioned on the organic layer, and has electrical connection through the anode connection opening of the organic layer;
    a black pixel defining layer that includes an anode exposing opening exposing the anode, and includes a black-colored organic material;
    a cathode that is positioned on the black pixel defining layer and the anode; and
    an encapsulation layer that covers the cathode, wherein the anode comprises:
an anode center portion that overlaps the anode exposing opening of the black pixel defining layer, and has a triple-layer structure; and
an anode peripheral portion that extends from the anode center portion, and includes a transparent conductive material,
the triple-layer structure includes:
a lower layer and an upper layer that include a transparent conductive material; and
a middle layer that includes a metal material and reflects light,
the anode peripheral portion has a single-layer structure, and
the upper layer of the anode center portion extends to form the anode peripheral portion.

2. The light emitting display device of claim 1, wherein the anode peripheral portion covers a side surface of the anode center portion.

3. The light emitting display device of claim 1, wherein a part of the anode center portion overlaps the black pixel defining layer.

4. The light emitting display device of claim 3, wherein a gap between the anode exposing opening of the black pixel defining layer and an end of the anode center portion is equal to or greater than about 1.5 μm and equal to or less than about 3.5 μm.

5. The light emitting display device of claim 4, wherein a gap between the anode exposing opening of the black pixel defining layer and an end of the anode peripheral portion is equal to or greater than about 5.5 μm and equal to or less than about 9.5 μm.

6. The light emitting display device of claim 5, further comprising:
a light blocking layer that is positioned on the encapsulation layer and includes a color filter opening; and
a color filter that fills the color filter opening of the light blocking layer.

7. The light emitting display device of claim 6, wherein a gap between the color filter opening of the light blocking layer and the end of the anode center portion is larger than a gap between the color filter opening of the light blocking layer and the end of the anode peripheral portion.

8. The light emitting display device of claim 7, wherein the gap between the color filter opening of the light blocking layer and the end of the anode center portion is equal to or greater than about 3.5 μm and equal to or less than about 8.5 μm.

9. The light emitting display device of claim 8, wherein the gap between the color filter opening of the light blocking layer and the end of the anode peripheral portion is equal to or greater than about 1.0 μm and equal to or less than about 2.0 μm.

10. The light emitting display device of claim 6, wherein a gap between the color filter opening of the light blocking layer and the anode exposing opening of the black pixel defining layer is equal to or greater than about 4.5 μm and equal to or less than about 7.5 μm.

11. The light emitting display device of claim 6, further comprising:
a sensing electrode that overlaps the light blocking layer in a plan view, and is covered by the light blocking layer, wherein
the anode connection opening of the organic layer overlaps the black pixel defining layer and the light blocking layer, and
the anode connection opening of the organic layer overlaps at least a part of the sensing electrode in the plan view.

12. The light emitting display device of claim 1, wherein the anode further comprises:
an extension portion that extends from the anode center portion, and has the triple-layer structure.

13. The light emitting display device of claim 12, wherein a gap between the anode center portion and the anode connection opening is equal to or less than about 12 μm.

14. The light emitting display device of claim 1, wherein the transparent conductive material comprises at least one of an indium tin oxide (ITO), an indium zinc oxide (IZO), and a transparent conductive oxide (TCO).

15. The light emitting display device of claim 14, wherein the middle layer comprises at least one of silver (Ag), lithium (Li), calcium (Ca), aluminum (Al), magnesium (Mg), and gold (Au).

16. The light emitting display device of claim 15, wherein the lower layer and the upper layer comprise an indium tin oxide (ITO), and the middle layer comprises silver (Ag).

* * * * *